(12) United States Patent
Kao et al.

(10) Patent No.: US 11,322,412 B2
(45) Date of Patent: May 3, 2022

(54) FORMING NITROGEN-CONTAINING LOW-K GATE SPACER

(71) Applicant: Taiwan Semiconductor Manufacturing Co., Ltd., Hsinchu (TW)

(72) Inventors: Wan-Yi Kao, Baoshan Township (TW); Chung-Chi Ko, Nantou (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/140,857

(22) Filed: Jan. 4, 2021

(65) Prior Publication Data

US 2021/0125874 A1 Apr. 29, 2021

Related U.S. Application Data

(60) Continuation of application No. 16/906,621, filed on Jun. 19, 2020, which is a division of application No. 16/057,308, filed on Aug. 7, 2018, now Pat. No. 10,692,773.

(60) Provisional application No. 62/692,088, filed on Jun. 29, 2018.

(51) Int. Cl.
*H01L 21/8234* (2006.01)
*H01L 29/66* (2006.01)
*H01L 27/088* (2006.01)
*H01L 21/02* (2006.01)
(Continued)

(52) U.S. Cl.
CPC .. *H01L 21/823468* (2013.01); *H01L 21/0214* (2013.01); *H01L 21/0228* (2013.01); *H01L 21/02211* (2013.01); *H01L 21/02337* (2013.01); *H01L 21/31111* (2013.01); *H01L 21/32135* (2013.01); *H01L 21/823431* (2013.01); *H01L 21/823437* (2013.01); *H01L 29/6656* (2013.01); *H01L 29/66545* (2013.01); *H01L 21/823475* (2013.01); *H01L 27/0886* (2013.01)

(58) Field of Classification Search
CPC ....... H01L 21/823468; H01L 21/02337; H01L 21/0214; H01L 21/0228; H01L 29/66545; H01L 29/6656; H01L 21/32135; H01L 21/31111
USPC ......... 438/197, 279, 283, 595; 257/288, 410
See application file for complete search history.

(56) References Cited

U.S. PATENT DOCUMENTS

| | | |
|---|---|---|
| 7,332,427 B2 | 2/2008 | Yeom |
| 10,541,127 B2 | 1/2020 | Tak et al. |
| 2006/0131672 A1 | 6/2006 | Wang et al. |

(Continued)

FOREIGN PATENT DOCUMENTS

| | | |
|---|---|---|
| KR | 20050068061 A | 7/2005 |
| KR | 20160059861 A | 5/2016 |

(Continued)

*Primary Examiner* — Thinh T Nguyen
(74) *Attorney, Agent, or Firm* — Slater Matsil, LLP

(57) ABSTRACT

A method includes forming a dummy gate stack over a semiconductor region of a wafer, and depositing a gate spacer layer using Atomic Layer Deposition (ALD) on a sidewall of the dummy gate stack. The depositing the gate spacer layer includes performing an ALD cycle to form a dielectric atomic layer. The ALD cycle includes introducing silylated methyl to the wafer, purging the silylated methyl, introducing ammonia to the wafer, and purging the ammonia.

20 Claims, 23 Drawing Sheets

(51) Int. Cl.
*H01L 21/311* (2006.01)
*H01L 21/3213* (2006.01)

(56) References Cited

U.S. PATENT DOCUMENTS

| | | |
|---|---|---|
| 2014/0110798 A1 | 4/2014 | Cai et al. |
| 2016/0141381 A1* | 5/2016 | Kim et al. ........ H01L 29/42364 |
| 2016/0372567 A1 | 12/2016 | Tak et al. |
| 2018/0122643 A1 | 5/2018 | Cheng et al. |
| 2018/0151373 A1 | 5/2018 | Tsai et al. |

FOREIGN PATENT DOCUMENTS

| | | |
|---|---|---|
| KR | 20170053371 A | 5/2017 |
| WO | 2017111774 A1 | 6/2017 |

* cited by examiner

FORMING NITROGEN-CONTAINING LOW-K GATE SPACER

PRIORITY CLAIM AND CROSS-REFERENCE

This application is a continuation of U.S. patent application Ser. No. 16/906,621, filed Jun. 19, 2020, entitled "Forming Nitrogen-Containing Low-K Gate Spacer," which application is a divisional of U.S. patent application Ser. No. 16/057,308, filed Aug. 7, 2018, entitled "Forming Nitrogen-Containing Low-K Gate Spacer," now U.S. Pat. No. 10,692,773 issued Jun. 23, 2020, which application claims the benefit of U.S. Provisional Application No. 62/692,088, filed Jun. 29, 2018, entitled "Forming Nitrogen-Containing Low-K Gate Spacer," which applications are hereby incorporated herein by reference.

BACKGROUND

Transistors are basic building elements in integrated circuits. In previous development of the integrated circuits, the gates of transistors are migrating from polysilicon gates to metal gates, which are typically formed as replacement gates. The formation of the replacement gates involves forming dummy gate stacks, forming gate spacers on sidewalls of the dummy gate stacks, removing the dummy gate stacks to form openings between the gate spacers, depositing gate dielectric layers and metal layers into the openings, and then performing a Chemical Mechanical Polish (CMP) process to remove excess portions of the gate dielectric layers and the metal layers. The remaining portions of the gate dielectric layers and the metal layers are replacement gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
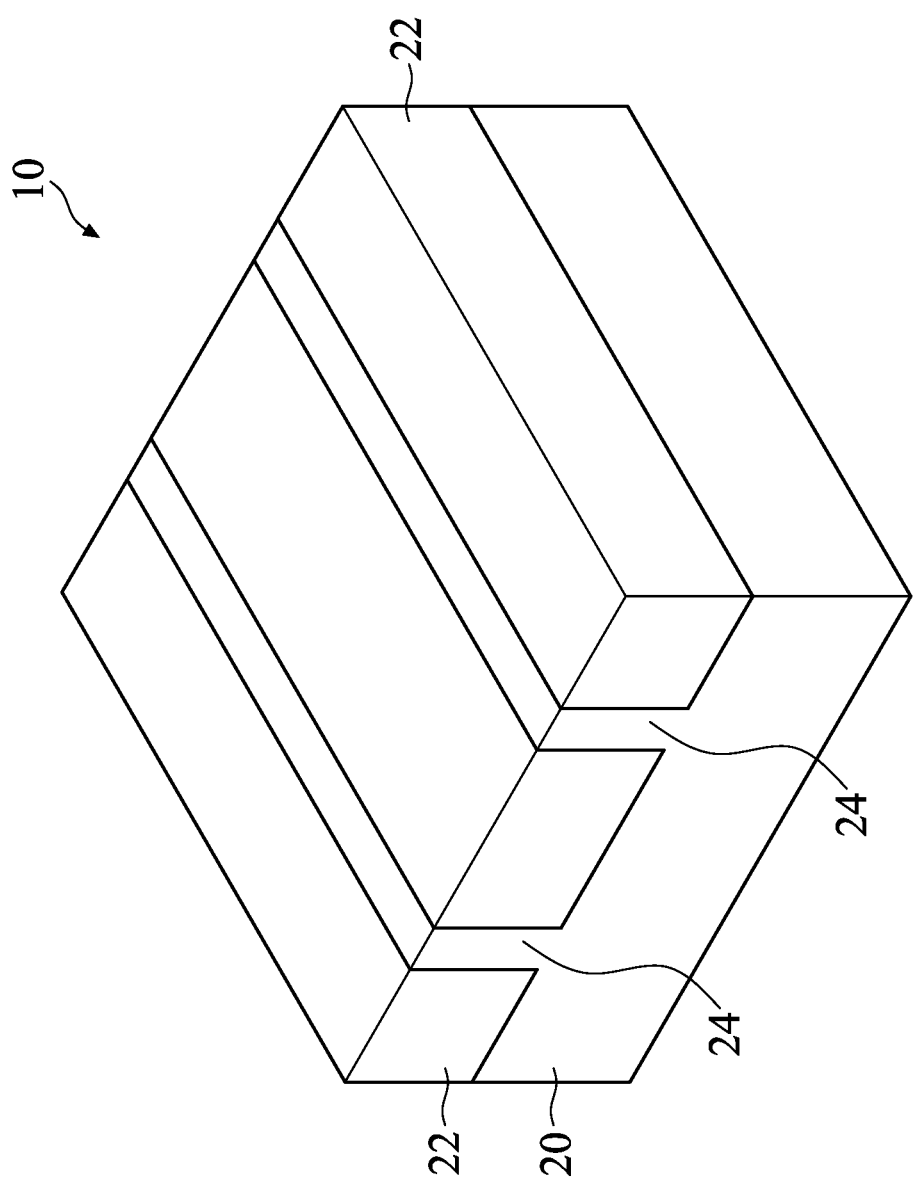
FIGS. 1, 2, 3A, 3B, 4A, 4B, 5, 6A, 6B, 7A, 7B, 8, 9A, 9B and 10 through 11 illustrate the cross-sectional views and perspective views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided in accordance with various embodiments. The intermediate stages of forming the FinFET are illustrated in accordance with some embodiments. Some variations of some embodiments are discussed. Throughout the various views and illustrative embodiments, like reference numbers are used to designate like elements. In accordance with some embodiments of the present disclosure, the gate spacer of the FinFET is doped with nitrogen and still has a lower-k value. With the reduced k value, the parasitic capacitance in the resulting circuit is reduced. With the added nitrogen, the gate spacer is more resistant to the damage incurred by the plasma used in the subsequent dummy gate removal process.

Figure 17:
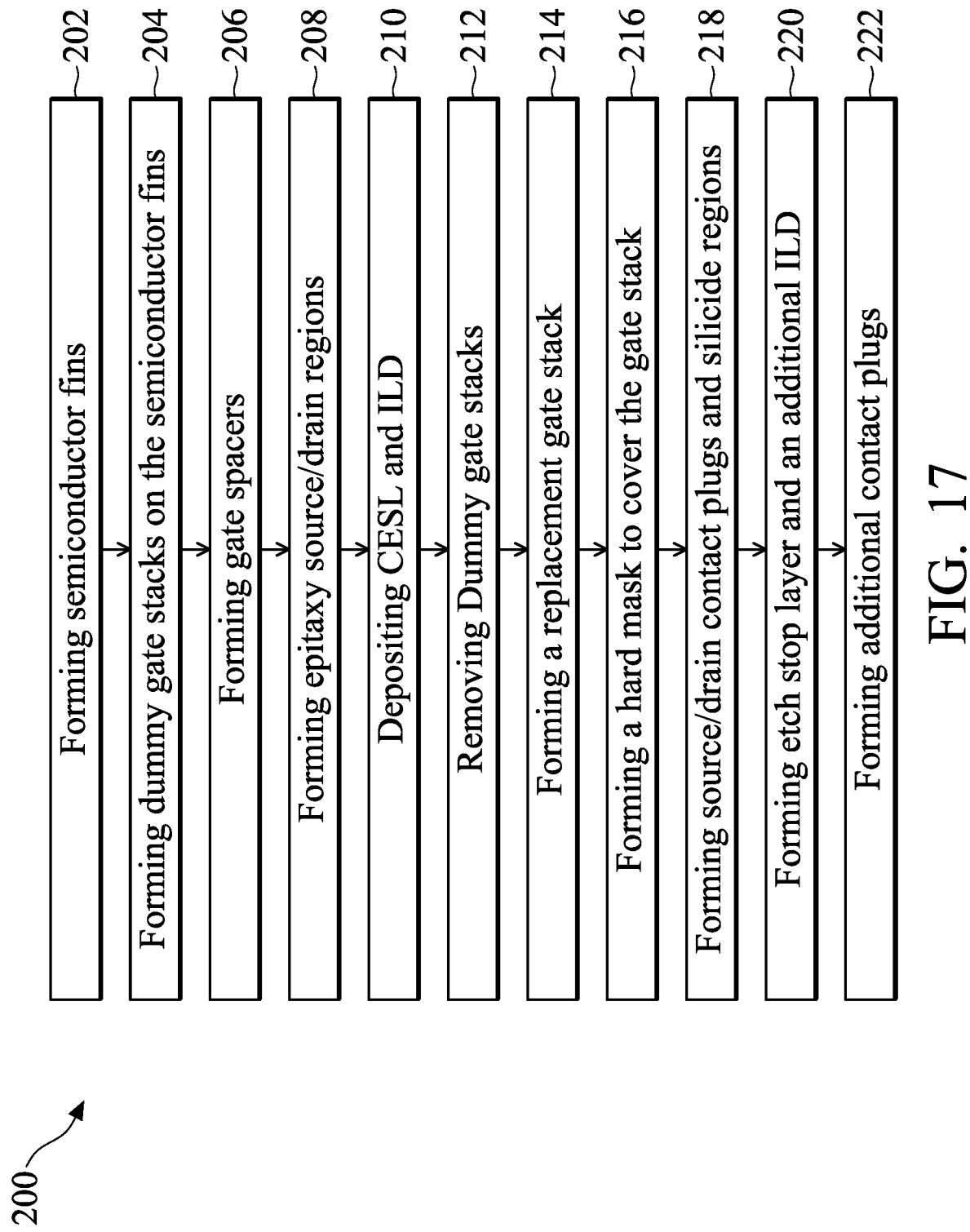
FIG. 17 illustrates a process flow for forming a FinFET in accordance with some embodiments.

FIGS. 1 through 11 illustrate the perspective views and cross-sectional views of intermediate stages in the formation of a FinFET in accordance with some embodiments of the present disclosure. The steps shown in FIGS. 1 through 11 also reflected schematically in the process flow 200 as shown in FIG. 17.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments of the present disclosure, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on coating, or the like.

Figure 2:
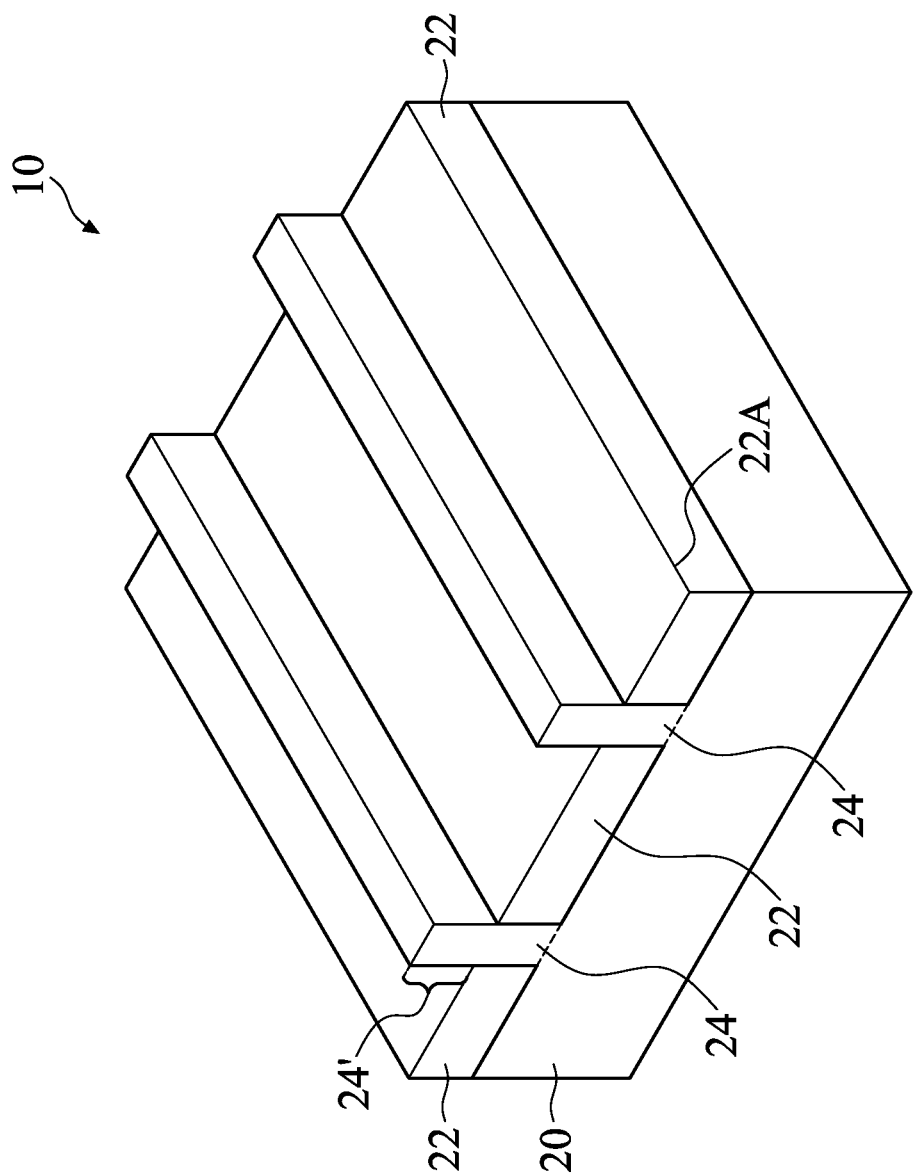

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 202 in the process flow shown in FIG. 17. The etching may be performed using a dry etching process, wherein $HF_3$ and $NH_3$ are used as the etching gases. In accordance with alternative embodiments of the present disclosure, the recessing of STI regions 22 is performed using a wet etch process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 24' may also be replaced with materials different from that of substrate 20. For example, protruding fins 24' may be formed of Si, SiP, SiC, SiPC, SiGe, SiGeB, Ge, or a III-V compound semiconductor such as InP, GaAs, AlAs, InAs, InAlAs, InGaAs, or the like.

Figure 3A:
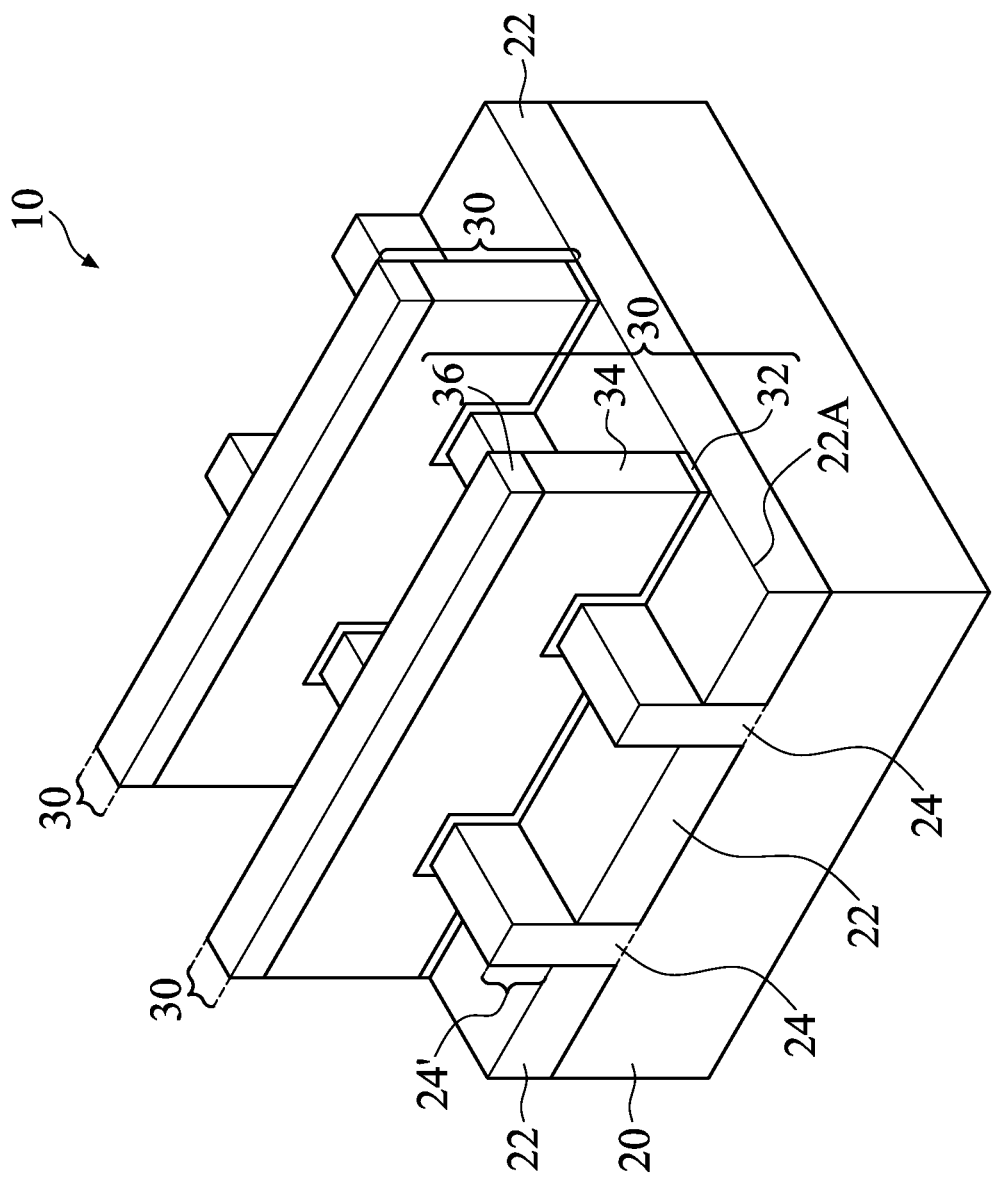

Referring to FIG. 3A, dummy gate stacks 30 are formed to cross protruding fins 24'. The respective process is illustrated as process 204 in the process flow shown in FIG. 17. Dummy gate stacks 30 may include dummy gate dielectrics 32 and dummy gate electrodes 34 over dummy gate dielectrics 32. Dummy gate dielectrics 32 may be formed of silicon oxide or other dielectric materials. Dummy gate electrodes 34 may be formed, for example, using polysilicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'. The formation of dummy gate stacks 30 includes depositing a dummy gate dielectric layer, depositing a gate electrode layer over the dummy gate dielectric layer, depositing a hard mask layer, and patterning the stack layers.

Figure 3B:
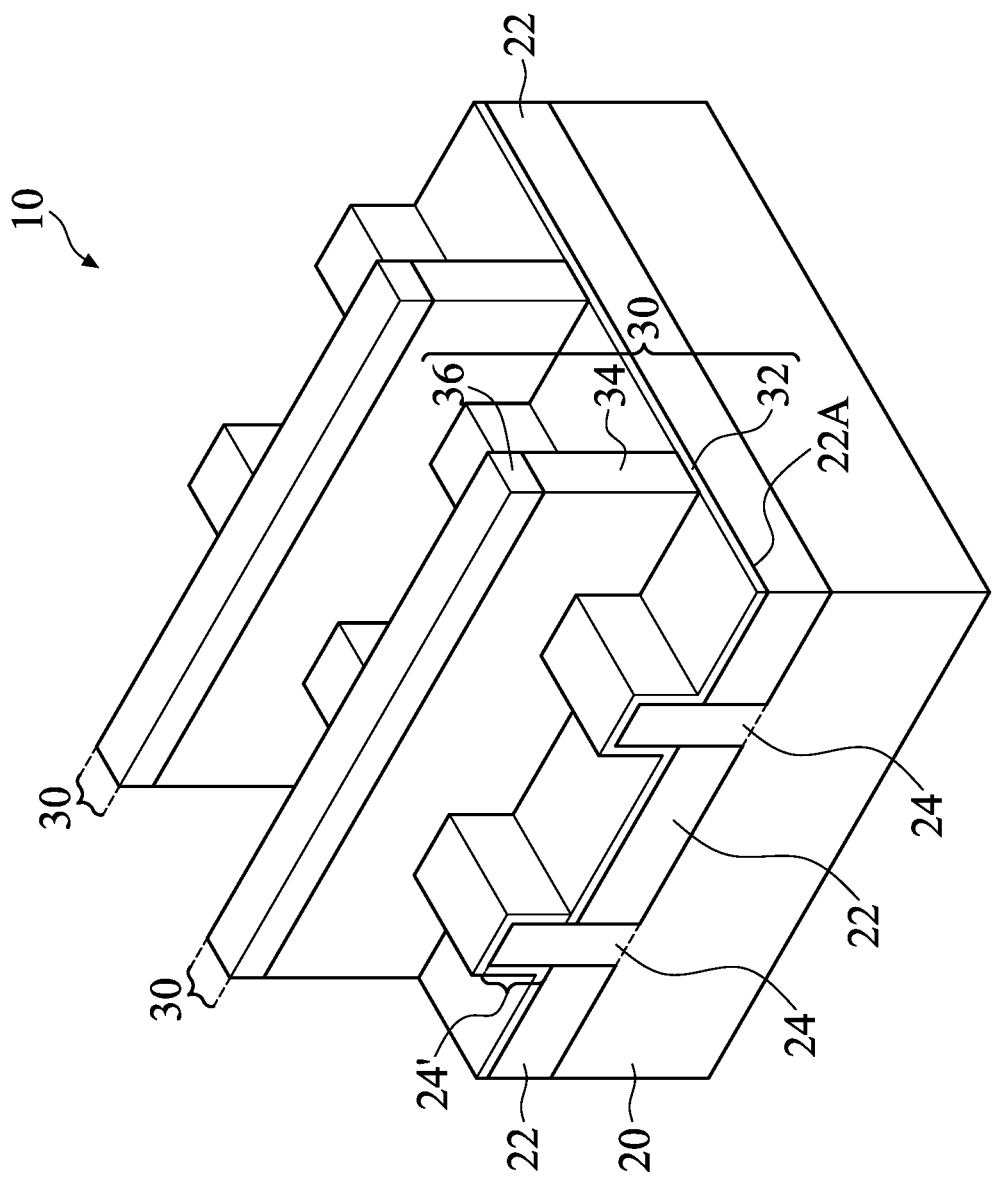

In accordance with alternative embodiments, as shown in FIG. 3B, after the deposition of the layers, the gate electrode layer and the hard mask layer are patterned to form dummy gate stacks 30, and gate dielectric 32 is not patterned. Dummy gate dielectric layer 32 thus covers the portions of the top surfaces and the sidewalls of protruding fins 24' that are not covered by dummy gate stacks 30.

Figure 4A:
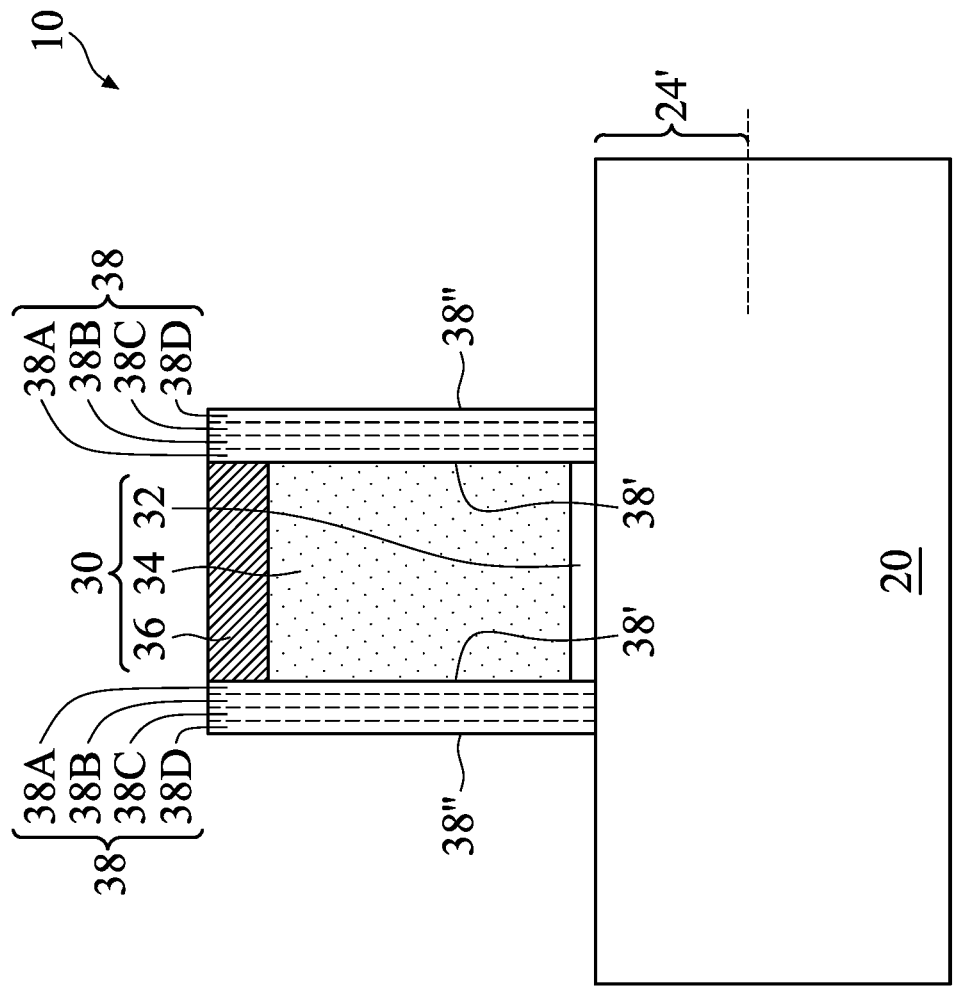
Figure 4B:
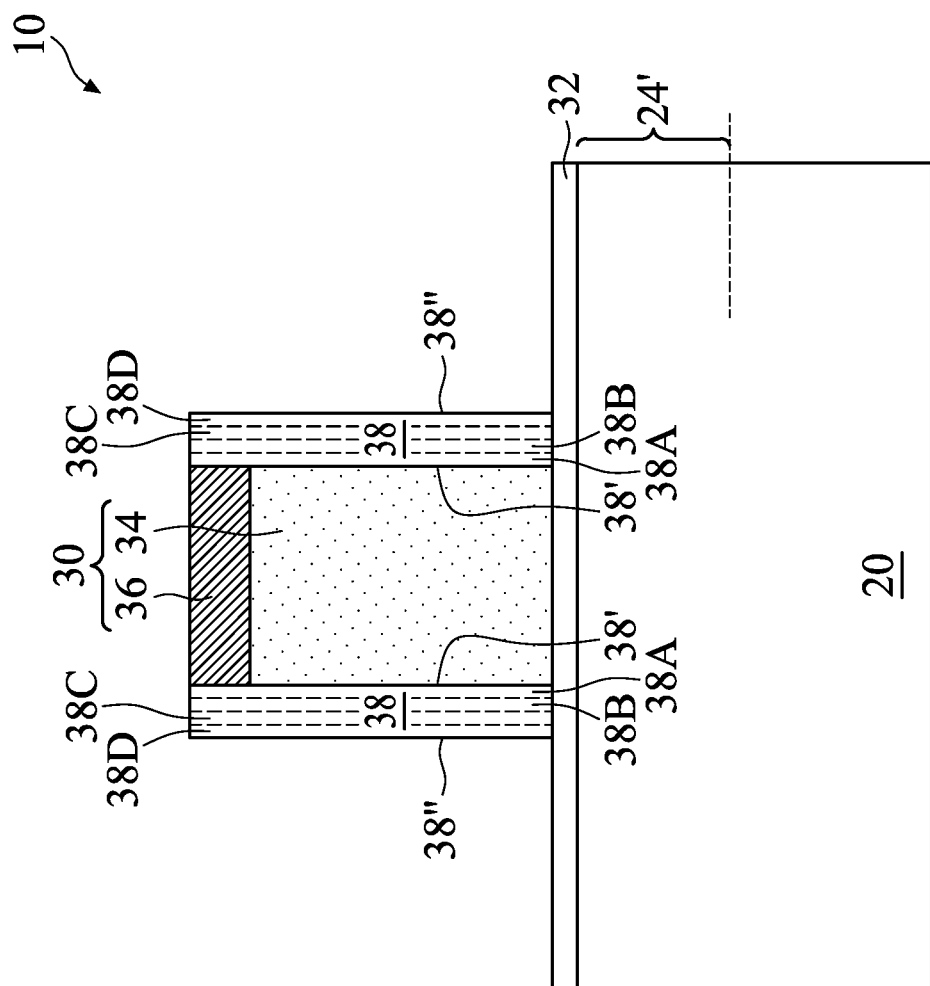

Next, referring to FIGS. 4A and 4B, gate spacers 38 are formed on the sidewalls of dummy gate stacks 30. The respective process is illustrated as process 206 in the process flow shown in FIG. 17. FIG. 4A illustrates the structure formed based on the structure shown in FIG. 3A, and FIG. 4B illustrates the structure formed based on the structure shown in FIG. 3B. The formation of gate spacers 38 may include depositing a dielectric layer(s) that include vertical and horizontal portions, and then performing an anisotropic etch to remove the horizontal portions, leaving the vertical portion as gate spacers 38. In the deposition process, the dielectric layer may be formed on the exposed surfaces of gate dielectric layer 32, gate stacks 30, and STI regions 22. In accordance with some embodiments of the present disclosure, gate spacers 38 are formed of a dielectric material comprising Si, N, O, C, and H. In addition, gate spacers 38 include at least some portions formed of low-k dielectric materials having k values lower than 3.9. The k value of at least some portions of gate spacers 38 may be in the range between about 3.0 and 3.9. The formation of gate spacers 38 is discussed referring to FIGS. 4A and 4B and FIGS. 12 through 15 as follows.

Figure 12:
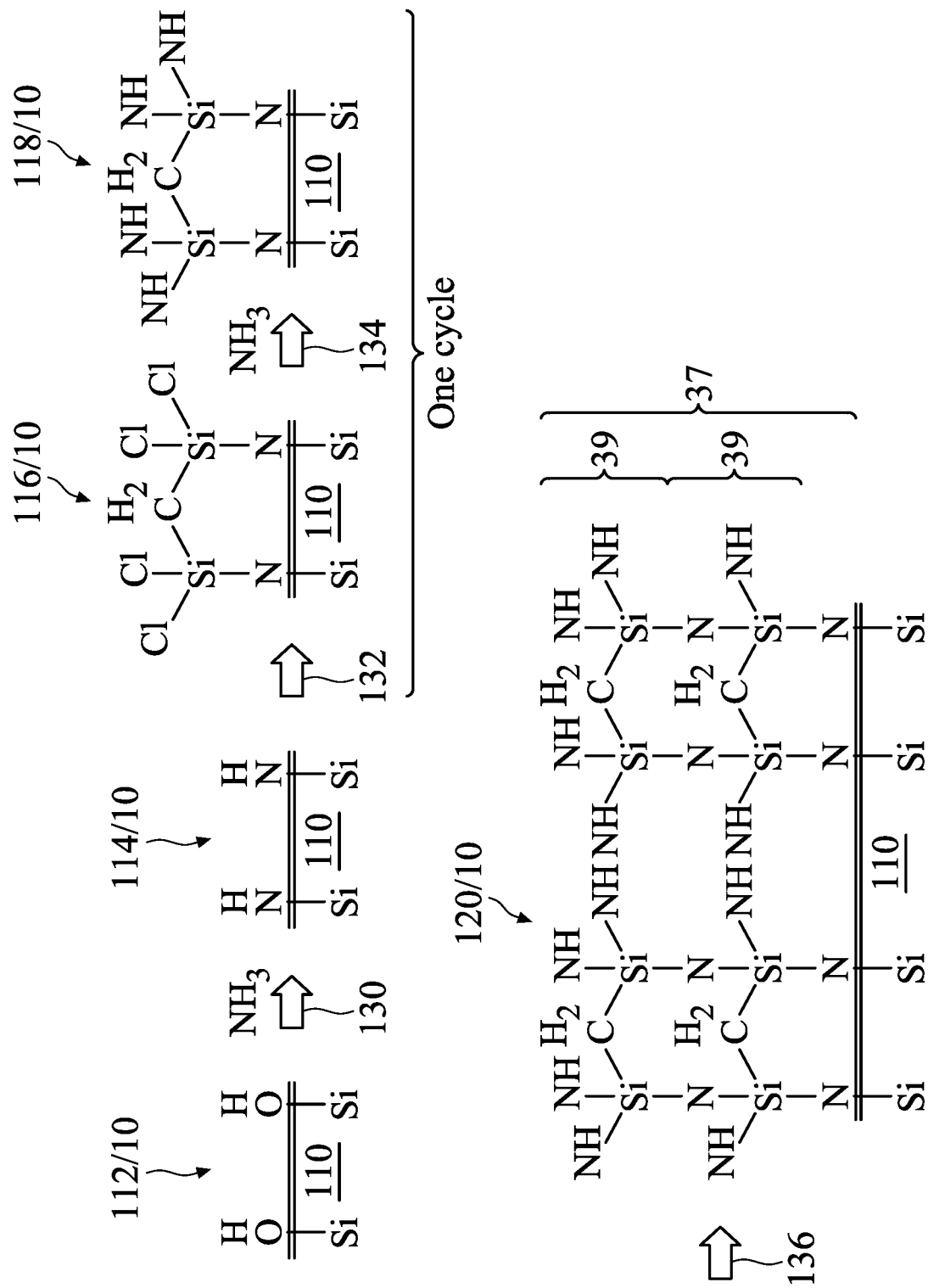
FIG. 12 illustrates the processes for forming gate spacers in accordance with some embodiments.

FIG. 12 illustrates the processes in the growth/deposition of gate spacer layer 37, which is then etched in an anisotropic etch to from gate spacers 38 as shown in FIGS. 4A and 4B. In the beginning of the deposition process, wafer 10 is placed in an ALD chamber. The intermediate structures shown in FIG. 12 are identified using reference numerals 112, 114, 116, 118, and 120 to distinguish the structures generated by each stage. Wafer 10 includes base layer 110, which may represent dummy gate electrodes 34, gate dielectric layers 32, STI regions 22, protruding fins 24', or the like as shown in FIGS. 3A and 3B, providing they are exposed in the beginning of the deposition process. In the illustrated example, base layer 110 is shown as including silicon, which may be in the form of crystalline silicon, amorphous silicon, or polysilicon. In accordance with some embodiments of the present disclosure, due to the formation of native oxide and the access to moisture, Si—OH bonds are formed at the surface of silicon-containing layer 110. Base layer 110 may include other types of silicon-containing materials such as silicon oxide, silicon nitride, silicon oxy-carbide, silicon oxynitride, or the like. The deposited layer 37 in FIG. 12 may also be deposited on other non-silicon-containing layers.

Further referring to FIG. 12, in process 130, ammonia ($NH_3$) is introduced/pulsed into the ALD chamber, in which wafer 10 (FIG. 3A or 3B) is placed. Wafer 10 is heated, for example, to a temperature in the range between about 200° C. and about 500° C. The Si—OH bonds as shown in structure 112 are broken, and silicon atoms are bonded with NH molecules to form Si—NH bonds. The resulting structure is referred to as structure 114. In accordance with some embodiments of the present disclosure, no plasma is turned on when NH₃ is introduced. The NH₃ may be kept in the chamber for a period of time between about 5 seconds and about 15 seconds.

Figure 13:
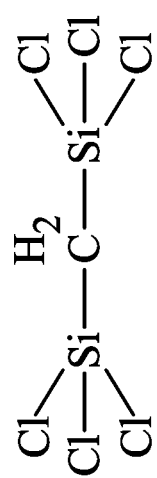
FIG. 13 illustrates a chemical formula of a silylated methyl in accordance with some embodiments.

Next, NH₃ is purged from the respective chamber. An ALD cycle is used to grow an atomic layer of a dielectric material. The ALD cycle includes processes 132 and 134 and the corresponding purge steps after each of processes 132 and 134. In process 132, silylated methyl is introduced. Silylated methyl may have a chemical formula as $(SiCl_3)_2CH_2$. FIG. 13 illustrates a chemical formula of silylated methyl in accordance with some embodiments. The chemical formula shows that silylated methyl includes chlorine atoms bonded to two silicon atoms, with the two silicon atoms bonded to a carbon atom. With the introduction/pulsing of silylated methyl, the temperature of wafer 10 is also kept elevated, for example, in the range between about 200° C. and about 500° C. The temperature may also be kept the same as in the process for introducing NH₃. In accordance with some embodiments of the present disclosure, no plasma is turned on when silylated methyl is introduced. The silylated methyl may have a pressure in the range between about 0.5 torr and about 10 torr.

Structure 114 reacts with silylated methyl. The resulting structure is referred to as structure 116. The N—H bonds in structure 114 are broken, and the Si—Cl bond of each of silicon atoms is broken, so that each of silicon atoms is bonded to one of nitrogen atoms. Accordingly, a silylated methyl molecule is bonded to two nitrogen atoms. In process 132, the silylated methyl may be kept in the ALD chamber for a period of time between about 5 seconds and about 15 seconds. Silylated methyl is then purged from the respective chamber.

Next, further referring to process 134 in FIG. 12, NH₃ is introduced into the ALD chamber, and NH₃ reacts with structure 116 to form structure 118. As a result, the Si—Cl bonds as shown in structure 116 are broken, and silicon atoms are bonded with NH molecules to form Si—NH bonds. In accordance with some embodiments of the present disclosure, during the introduction of NH₃, wafer 10 is heated, for example, to a temperature in the range between about 200° C. and about 500° C. Plasma may not be turned on. The NH₃ may be kept in the ALD chamber for a period of time between about 5 seconds and about 15 seconds. NH₃ may have a pressure in the range between about 0.5 torr and about 10 torr. Next, NH₃ is purged from the respective chamber. The first ALD cycle, which includes 132 and 134 and the corresponding purge processes, is thus finished. The first ALD cycle results in the formation of atomic layer 39.

A second ALD cycle (process 136) is performed. The second ALD cycle 136 is performed essentially the same as the ALD cycle that includes processes 132 and 134 and the corresponding purge processes. Similarly, in the introduction of silylated methyl in the second ALD cycle, structure 118 (on wafer 10) reacts with silylated methyl. Some of the N—H bonds (structure 118) are broken, and the Si—Cl bonds (FIG. 13) of each of silicon atoms in the silylated methyl are broken, and are then bonded to the nitrogen atoms. Accordingly, a silylated methyl molecule is bonded to two nitrogen atoms. The silylated methyl may be kept in the chamber for a period of time between about 5 seconds and about 15 seconds. Next, silylated methyl is purged from the respective chamber. NH₃ is then introduced, which causes Si—Cl bonds to be broken, and NH molecules are bonded to silicon atoms. As shown in FIG. 12, the second ALD cycle causes another atomic layer to be grown. In accordance with some embodiments of the present disclosure, during the second ALD cycle, wafer 10 is also heated, for example, to a temperature in the range between about 200° C. and about 500° C. Plasma may not be turned on during the second ALD cycle. The second ALD cycle results in the formation of another atomic layer 39 on the previously formed atomic layer 39.

A plurality of ALD cycles, each being essentially the same as the first ALD cycle, are then performed, during each an atomic layer (similar to atomic layer 39) of dielectric layer 37 is grown. Each of the ALD cycles cause the thickness of gate spacers 38 to increase, or example, by about 0.5 Å, and eventually gate spacer layer 37 is formed. The gate spacer layer 37 is then patterned in an anisotropic etching process, resulting in the gate spacers as shown in FIGS. 4A and 4B. In accordance with some embodiments of the present disclosure, the total thickness of gate spacer layer 37 (and the corresponding gate spacers 38) is greater than about 20 Å, and may be in the range between about 20 Å and about 70 Å, depending on the design requirement. In accordance with some embodiments of the present disclosure, the ALD cycles are performed with wafer 10 being kept at a same temperature. In accordance with alternative embodiments, different ALD cycles may be performed at different temperatures, as discussed in subsequent paragraphs.

It is appreciated that the processes as discussed are not limited to the formation of gate spacers, and can be used for forming dielectric layers and other vertical dielectric features.

The gate spacer layer 37 (FIG. 12) and gate spacers 38 (FIGS. 4A and 4B) formed using the ALD cycles include SiNOCH. The k value of the resulting gate spacers 38, as formed (before going through the subsequent anneal process), may be higher than about 7 or higher. In accordance with some embodiments of the present disclosure, gate spacers 38 formed through the ALD cycles have a nitrogen atomic percentage in the range between about 3 percent and about 30 percent, depending on the process conditions. The atomic percentage of nitrogen in gate spacers 38 is related to the temperature of the ALD cycles, and higher temperatures result in higher percentages of nitrogen, and lower temperatures result in lower atomic percentages of nitrogen.

Referring back to FIGS. 4A and 4B, gate spacers 38 may have uniform compositions (with uniform percentages of Si, O, C, H, and/or N). In accordance with alternative embodiments, gate spacers 38 may have may have different portions (sub layers) that have different compositions, for example, different nitrogen atomic percentages. The different portions are schematically represented by sub layers 38A, 38B, 38C, and 38D. The sub-layers in gate spacers 38 are formed according to the sequence of 38A→38B→38C→38D.

It is appreciated that in subsequent steps (FIGS. 7B and 8), the dummy gate stacks are removed, which may involve the dry etching in which plasma is generated. Gate spacers 38, particularly the inner portions such as sub layer 38A, are exposed to the damage of the plasma, and may be adversely etched away. When gate spacers 38 have higher nitrogen atomic percentages, they are more resistant to the damage caused by the plasma. Accordingly, In accordance with some embodiments of the present disclosure, sub layer 38A may be formed with a higher nitrogen percentage than remaining sub layers 38B, 38C, and 38D at the time the dummy gate stacks 30 are removed (FIG. 8).

Figure 16A:
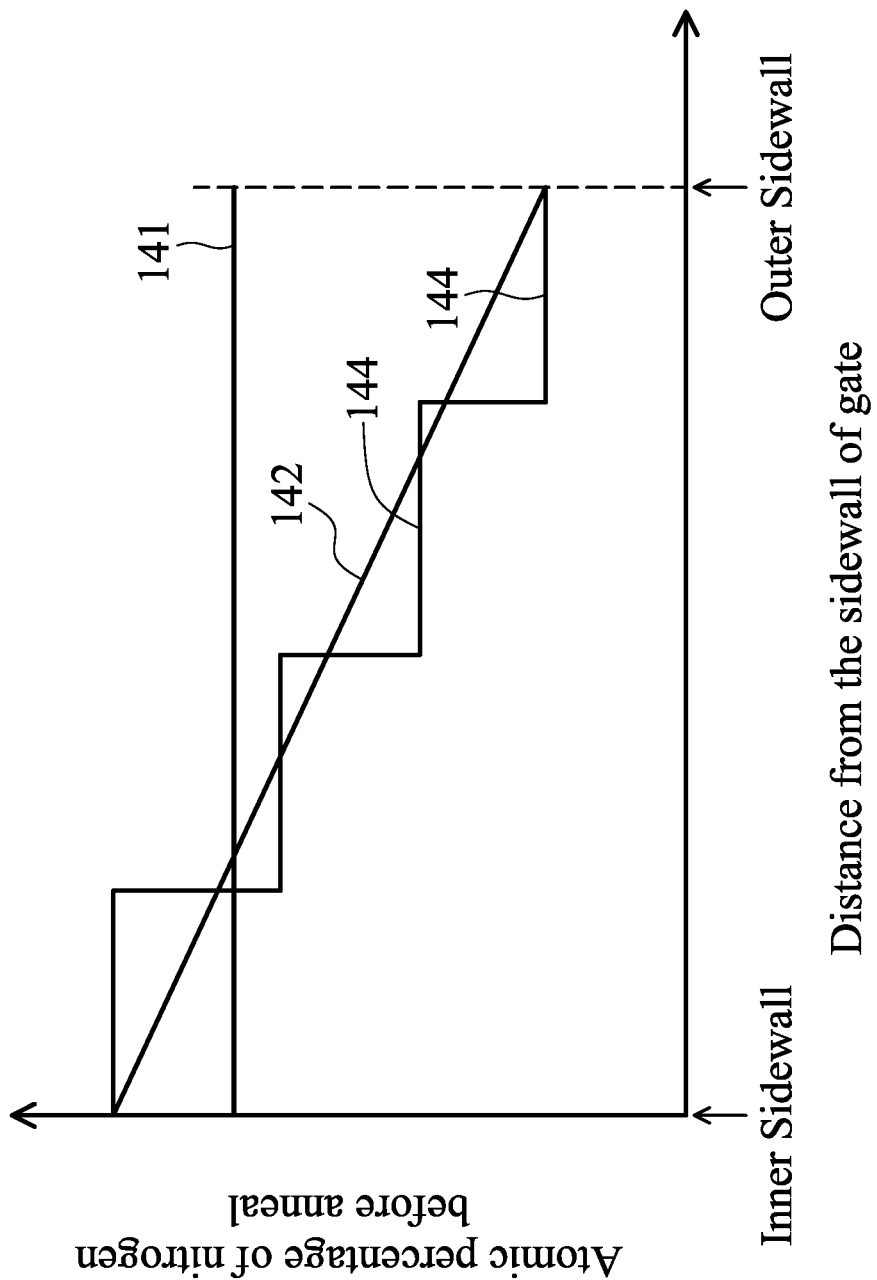
FIG. 16A schematically illustrates the nitrogen atomic percentages in parts of gate spacers before anneal in accordance with some embodiments.
Figure 16B:
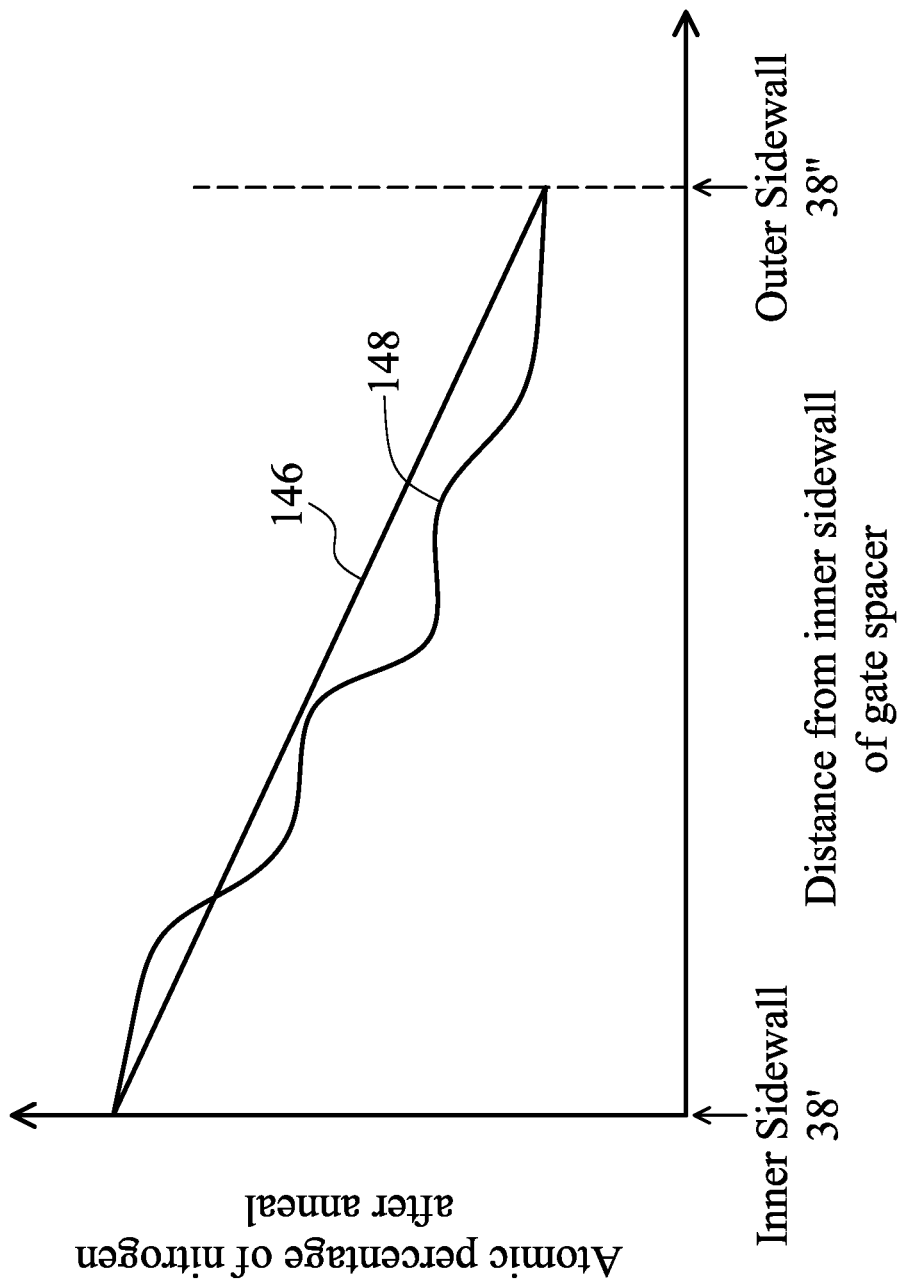
FIG. 16B illustrates the nitrogen atomic percentages in parts of gate spacers after anneal in accordance with some embodiments.

The sub layers 38A, 38B, 38C, and 38D (as deposited) may have nitrogen atomic percentages in the range between about 3 percent and about 30 percent at the time they are deposited. In accordance with some embodiments of the present disclosure, the entireties of gate spacers 38 (including all sub layers 38A, 38B, 38C, and 38D), as deposited, have a same nitrogen atomic percent. In accordance with alternative embodiments, in the direction from 38A→38B→38C→38D, the nitrogen atomic percentages reduce gradually. Due to the existence of the high-nitrogen sub layer 38A, gate spacers 38 have improved resistance to the damage of plasma in the step shown in FIG. 8 since sub layer 38A is exposed to the plasma. Due to the reduction of the nitrogen in sub layers 38B, 38C, and 38D, sub layers 38B, 38C, and 38D have reduced k values, and the overall k value of gate spacers 38 is reduced, resulting in reduced parasitic capacitance between the corresponding gate and surrounding features. Accordingly, having sub layers 38A, 38B, 38C, and 38D with reduced nitrogen atomic percentages can improve the resistance of gate spacers 38 to the plasma damage while still keeping parasitic capacitance low. In accordance with some embodiments of the present disclosure, the nitrogen atomic percentages continuously reduce from the inner sidewall 38' to the outer sidewall 38". This may be achieved, for example, by gradually reducing the temperature of wafer 10 during the formation of gate spacers 38. For example, the later performed ALD cycles may be performed at lower temperatures than the earlier performed ALD cycles, while other process conditions such as the pressures of silylated methyl and $NH_3$, the duration of the pulses, etc., may be the same from one ALD cycle to another. The temperature reduction may be continuous or in stages. For example, FIG. 16A illustrates some possible temperature profiles as a function of the distance of the respective sub layer from the inner sidewall 38' (FIGS. 4A and 4B). Line 141 represents a temperature profile in which the temperature is uniform throughout the deposition of layer 37 (FIG. 12). Line 142 represents a temperature profile in which the temperatures are continuously reduced. Line 144 represents a temperature profile in which temperatures are reduced in stages, wherein each stage may correspond to the formation of one sub layer or a plurality of sub layers. The resulting nitrogen atomic percentages may show similar trend of continuous reduction or the reduction in stages, as schematically shown in FIG. 16B. It is appreciated that although FIG. 16B illustrates the nitrogen atomic percentages after anneal as shown in lines 146 and 148, as discussed in subsequent paragraphs, the nitrogen atomic percentages show similar trend after the anneal, except the reduction of nitrogen atomic percentages become smoother after the anneal.

After the deposition (the growth) of gate spacers 38, an anneal is performed. The anneal may be performed either before or after etching gate spacer layer 37 (FIG. 12) to form gate spacers 38 (FIGS. 4A and 4B). In accordance with some embodiments of the present disclosure, the anneal is performed in an oxygen-containing environment, which may include steam ($H_2O$), oxygen ($O_2$), oxygen radicals (O), or the combinations thereof. The anneal may be performed at a temperature in the range between about 400° C. and about 500° C. The anneal may last for a period of time in the range between about 30 minutes and about two hours. The anneal results in pores to be formed in gate spacers 38, and the reduction of the k value of gate spacers 38. The anneal may be performed with or without plasma turned on. In accordance with some embodiments of the present disclosure, as a result of the anneal, the k value of gate spacers 38 is reduced by a value greater than 2.0, for example. The k value of gate spacers 38 may be reduced to lower than 3.9, hence gate spacers 38 may become low-k dielectric gate spacers.

Figure 14:
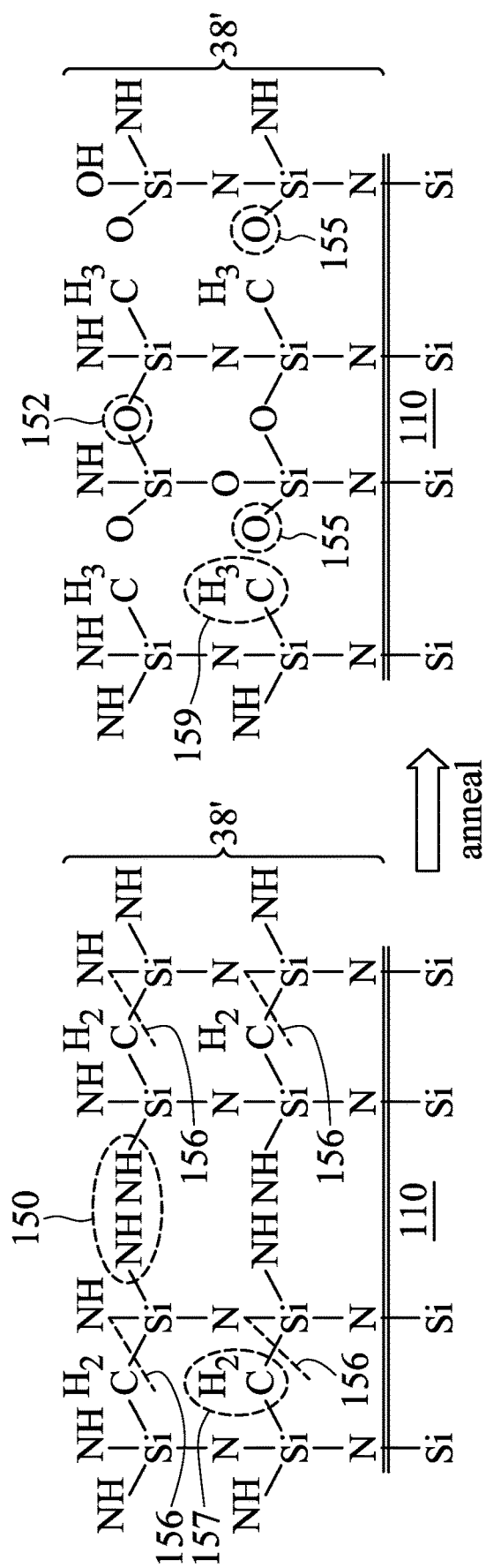
FIG. 14 illustrates the chemical reaction in a portion of a gate spacer in an anneal process in accordance with some embodiments.
Figure 15:
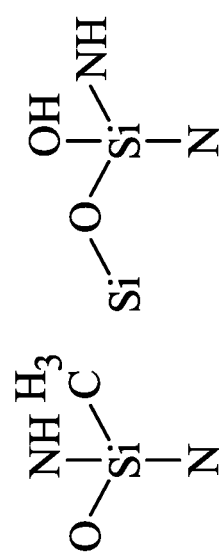
FIG. 15 illustrates the chemical reaction in a portion of a gate spacer in an anneal process in accordance with some embodiments.

FIG. 14 illustrates the structure change of gate spacers 38 before and after the anneal. As shown in FIG. 14, due to the anneal, two NH bonds, which are circled by circles 150, are replaced by an oxygen atom as shown in circle 152. Also, methylene bridge (—$CH_2$) 156 of two silicon atoms can also be broken and an additional hydrogen atom can attach to the carbon to form a methyl (—$CH_3$) functional group (in circle 159) attached to one of the silicon atoms. The other silicon atom, which is not attached to the methyl functional group (in circle 159) is then bonded to an oxygen atom (in circle 155). Pores may be formed in this process. Effectively, one of the Si—C bonds is replaced with a Si—O bond. FIG. 14 illustrates a portion of gate spacers 38, in which $CH_2$ (in circle 157) is replaced with a $CH_3$ group (in circle 159) and an oxygen atom (in circle 155). It is appreciated that the newly attached oxygen atoms (in circles 155) each has two bonds, with the other bonds not shown, which may be attached to other silicon atoms. FIG. 15 illustrates a portion of the spacer layer 37, wherein two silicon atoms are bonded to the newly attached oxygen atom. Due to the replacement of NH groups with oxygen and the formation of pores, the k value of gate spacers 38 is reduced.

The anneal temperature and the anneal duration affect the nitrogen atomic percentage and the k value of the resulting gate spacers 38. Before the anneal, the nitrogen atomic percentage is high, and the k value of gate spacers 38 is also high. For example, when the nitrogen atomic percentage is higher than about 10 percent, the k value of gate spacers 38 is higher than about 3.9. When the anneal temperature is low, with the increase in the temperature, more NH molecules are replaced with oxygen atoms, and more methylene bridges (—$CH_2$) are broken to form Si—$CH_3$ bonds. Accordingly, the k values become lower, and the nitrogen atomic percent also becomes lower. When temperature is further increased or the anneal is further prolonged, however, too much nitrogen atoms are lost, the k values will increase again. In accordance with some embodiments of the present disclosure, gate spacers 38 (when having low-k values) have nitrogen atomic percentage in the range between about 1 percent and about 10 percent, which is reduced from the nitrogen atomic percentage of 3 percent to 30 percent before the anneal. In accordance with some embodiments of the present disclosure, the anneal causes a first nitrogen atomic percentage in the resulting dielectric layers 38/38' to be reduced to a second nitrogen atomic percentage, and a ratio of the second nitrogen atomic percentage to the first nitrogen atomic percentage may be in a range between about ⅕ and about ½.

Also, the reduction in the nitrogen atomic percentage results in the resistance of gate spacers to the damage of plasma to be lowered. Accordingly, it is desirable that after the anneal, the nitrogen atomic percentage is in the range between about 1 percent and about 10 percent, and may be in the range between about 1 percent and about 5 percent. Accordingly, the anneal temperature is kept in a desirable range of about 400° C. and about 500° C. to achieve low k value without compromising the gate spacer's ability for resisting to the damage of plasma. The nitrogen atomic percentages in gate spacers 38 after the anneal may be as schematically shown in FIG. 16B, although the values of nitrogen atomic percentages are reduced than before the anneal. FIG. 16B illustrates the schematic nitrogen atomic percentage as a function of the distance from inner sidewalls 38' (FIGS. 4A and 4B). The reduction of nitrogen atomic percentages in the direction from inner sidewall 38' to outer sidewall 38" may be due to that the outer portions (closer to sidewalls 38") are annealed better than, and hence lose more nitrogen, than the inner portions (closer to sidewalls 38'). The reduction of nitrogen atomic percentages in the direction from inner sidewall 38' to outer sidewall 38" may also due to the atomic percent profile as show in FIG. 16A.

The anneal also causes the reduction in the density of gate spacers 38. For example, after the anneal, the density of gate spacers 38 may be reduced to lower than about 2.0 g/cm$^3$, and may fall into the range between about 1.6 g/cm$^3$ and about 1.9 g/cm$^3$, as compared to the density higher than about 2.3 g/cm$^3$ before the anneal.

In accordance with some embodiments of the present disclosure, after the anneal, sub layers 38A may have k values higher than other portions of gate spacers 38. Accordingly, sub layers 38A may be used as sealing layers to protect other portions such as sub layers 38B, 38C, and 38D from the damage of the plasma. After the anneal, sealing layers 38A may have a k value higher than, equal to, or lower than 3.9.

In accordance with other embodiments of the present disclosure, sub layers 38A are formed of silicon nitride, silicon oxy-carbide, or the like. The formation may also be performed using ALD, except the process gases are different. For example, when formed of silicon nitride, the process gases may include $NH_3$ and DiChloroSilane (DCS, $SiH_2Cl_2$). The resulting sealing layers 38A have a k value higher than 4.0, and the k value may be between about 4.0 and 7.0.

Figure 5:
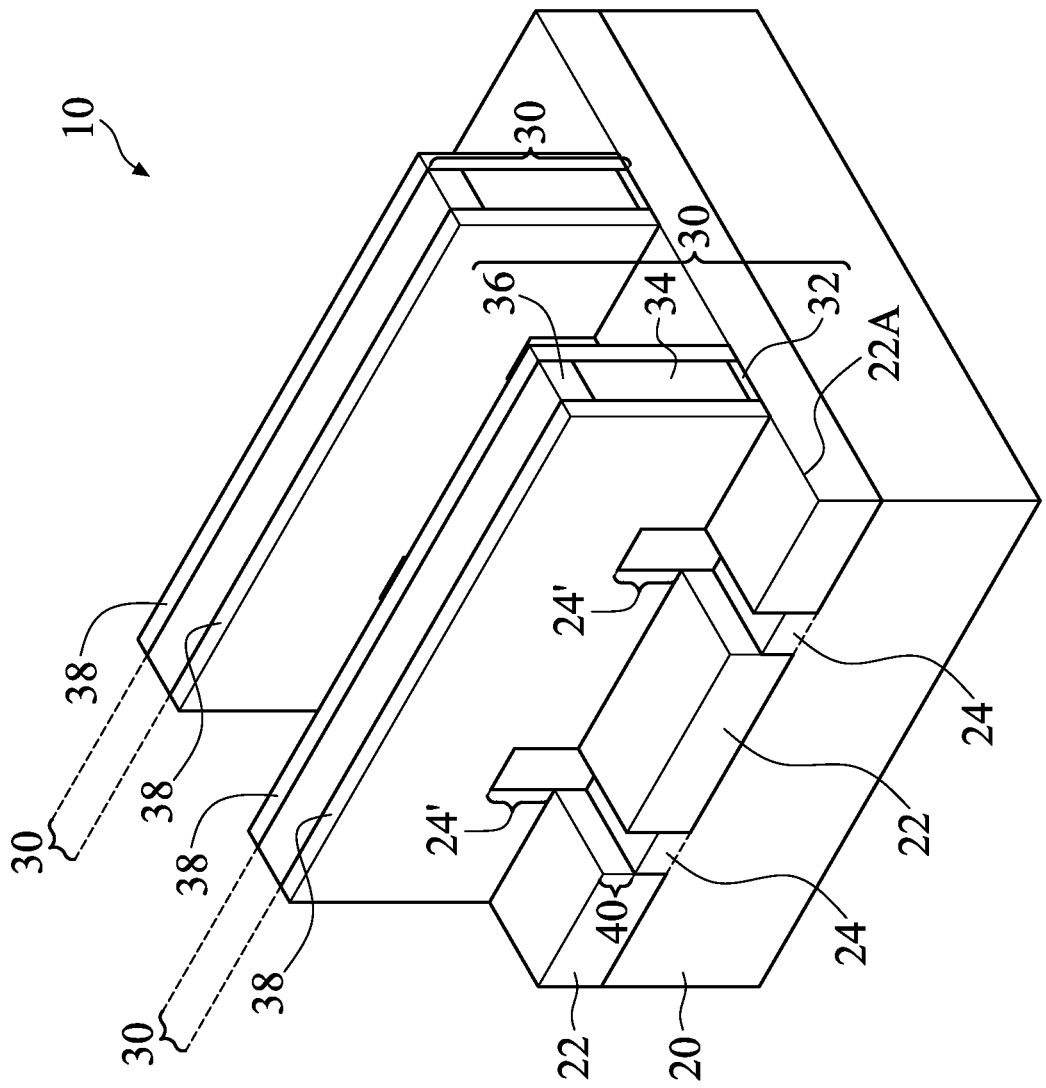
Figure 6A:
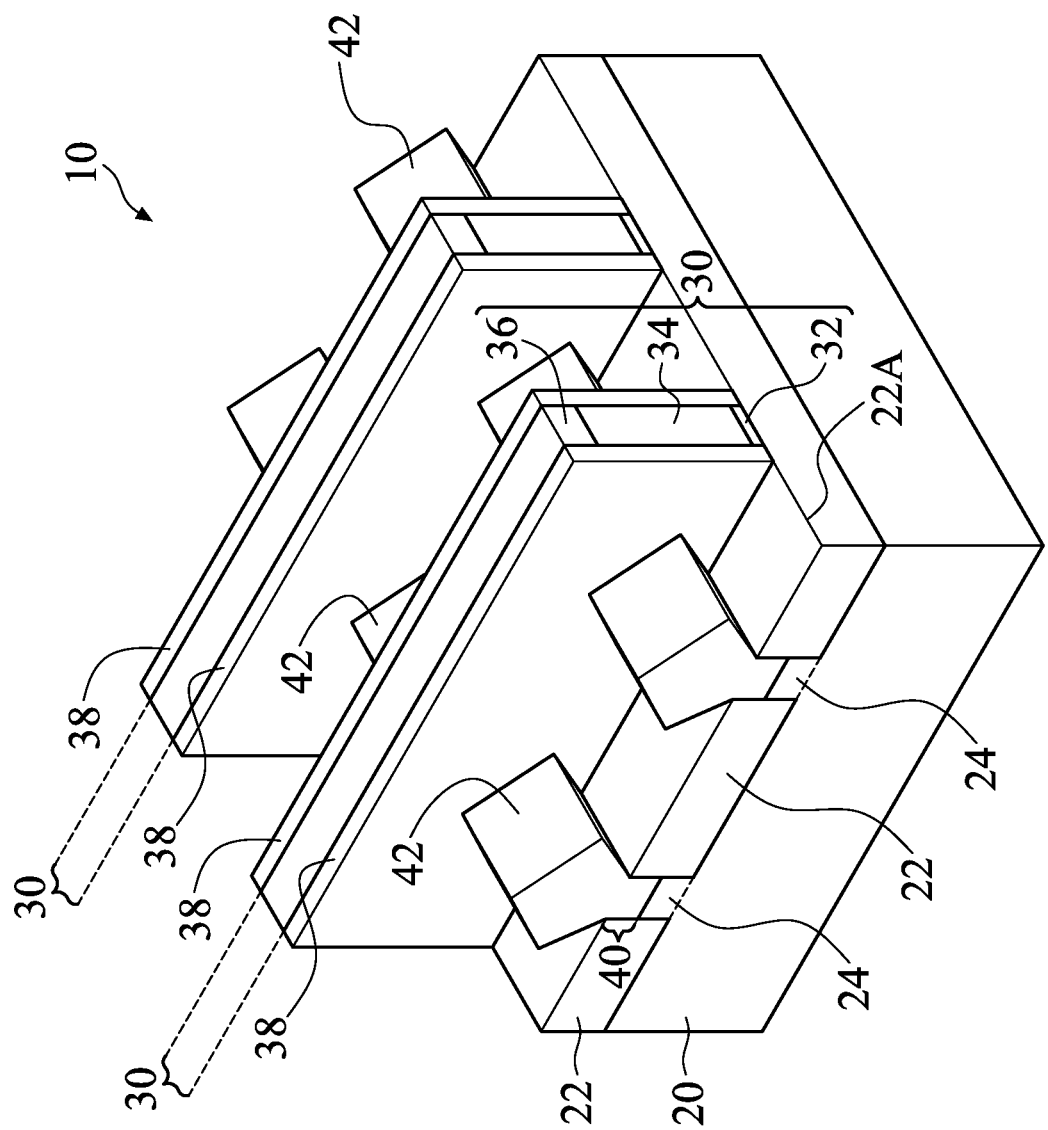
Figure 6B:
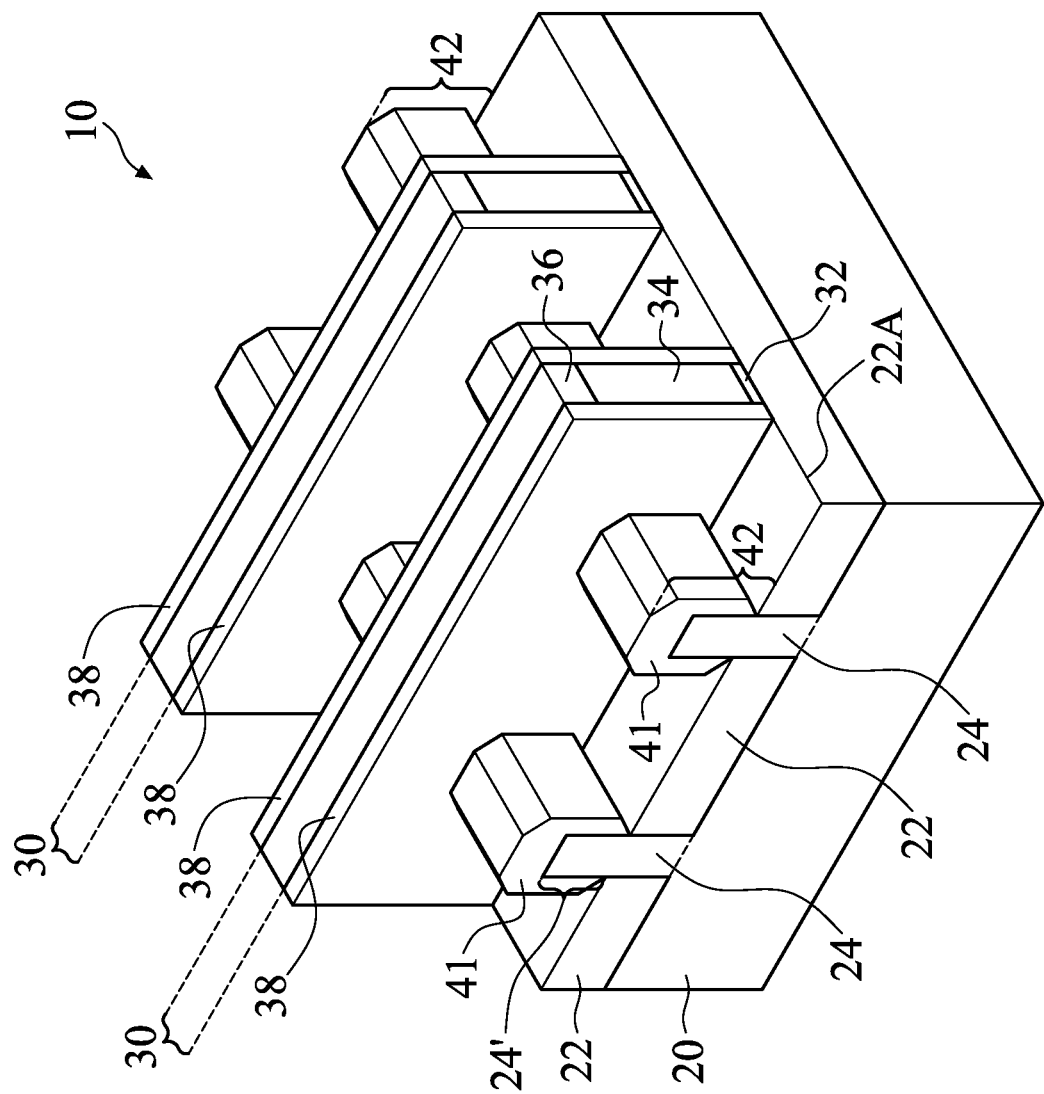

In subsequently illustrated Figures, the structure shown in FIG. 4A is used as an example. The structure formed based on FIG. 4B can also be appreciated. In subsequent steps, source/drain regions are formed, as illustrated in FIG. 5 and FIGS. 6A and 6B. The respective process is illustrated as process 208 in the process flow shown in FIG. 17. In accordance with some embodiments of the present disclosure, an etching process (referred to as fin recessing hereinafter) is performed to etch the portions of protruding fins 24' that are not covered by dummy gate stack 30 and gate spacers 38, resulting in the structure shown in FIG. 5. If dielectric layer 32 (FIG. 4B) have portions not covered by dummy gate stacks 30 and gate spacers 38, these portions are etched first. The recessing of protruding fins 24' may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Next, epitaxy regions (source/drain regions) 42 are formed by selectively growing a semiconductor material in recesses 40, resulting in the structure in FIG. 6A. In accordance with some embodiments of the present disclosure, epitaxy regions 42 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy to form source/drain regions. Epitaxy source/drain regions 42 include lower portions that are formed in STI regions 22, and upper portions that are formed over the top surfaces of STI regions 22.

FIG. 6B illustrates the formation of cladding source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy semiconductor material 42 as shown in FIG. 6A, depending on whether the resulting FinFET is a p-type or an n-type FinFET. Accordingly, source/drain regions 42 include protruding fins 24' and the epitaxy regions 41. An implantation may (or may not) be performed to implant an n-type impurity or a p-type impurity. It is appreciated that the source/drain regions 42 as shown in FIGS. 6A and 6B may be merged with each other, or remain as being separated.

Figure 7A:
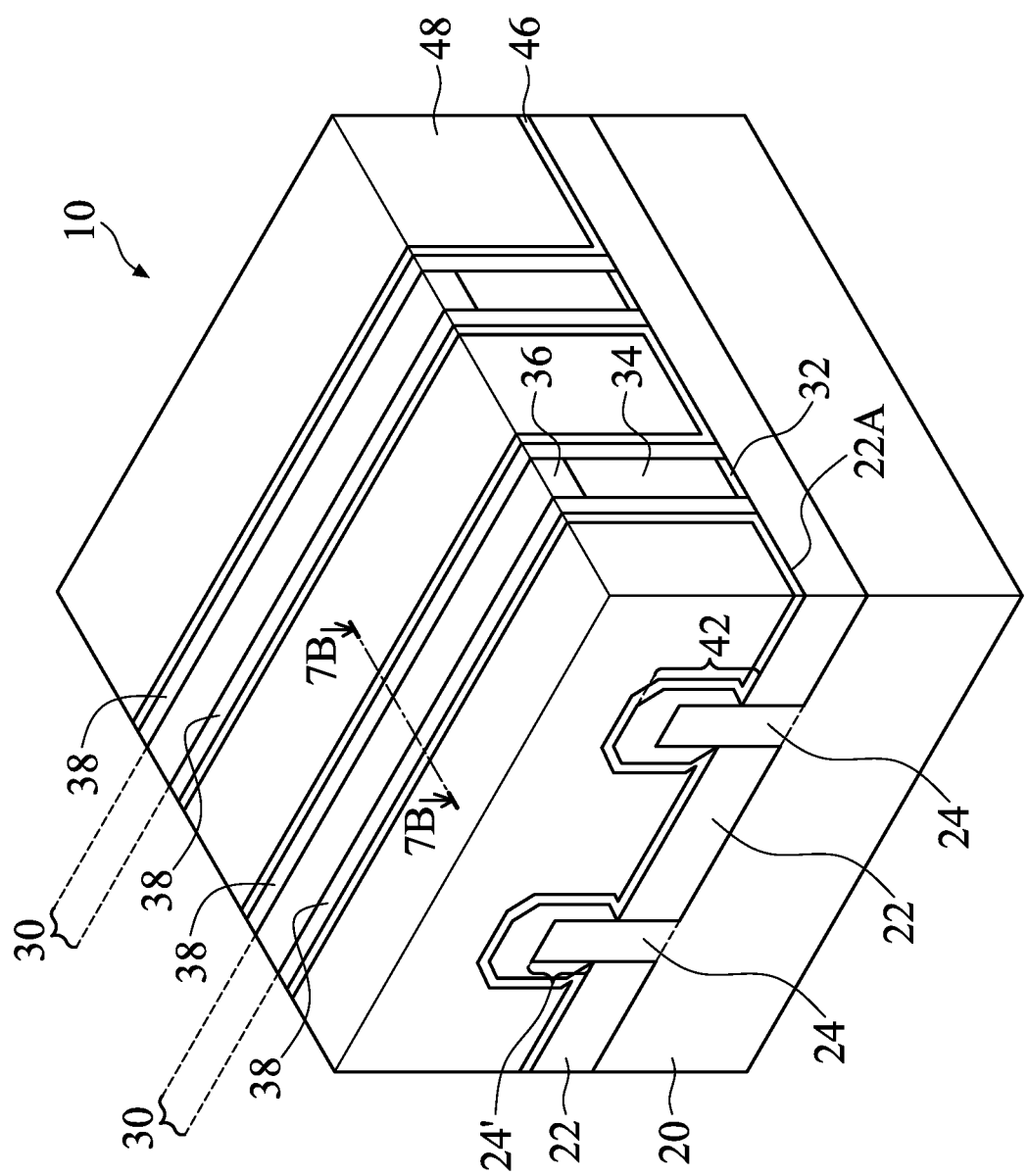

FIG. 7A illustrates a perspective view of the structure after the formation of Contact Etch Stop Layer (CESL) 46 and Inter-Layer Dielectric (ILD) 48. The respective process is illustrated as process 210 in the process flow shown in FIG. 17. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or other deposition methods. ILD 48 may also be formed of an oxygen-containing dielectric material, which may be a silicon-oxide based material such as a Tetra Ethyl Ortho Silicate (TEOS) oxide, a Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process is performed to level the top surfaces of ILD 48, dummy gate stacks 30, and gate spacers 38 with each other.

Figure 7B:
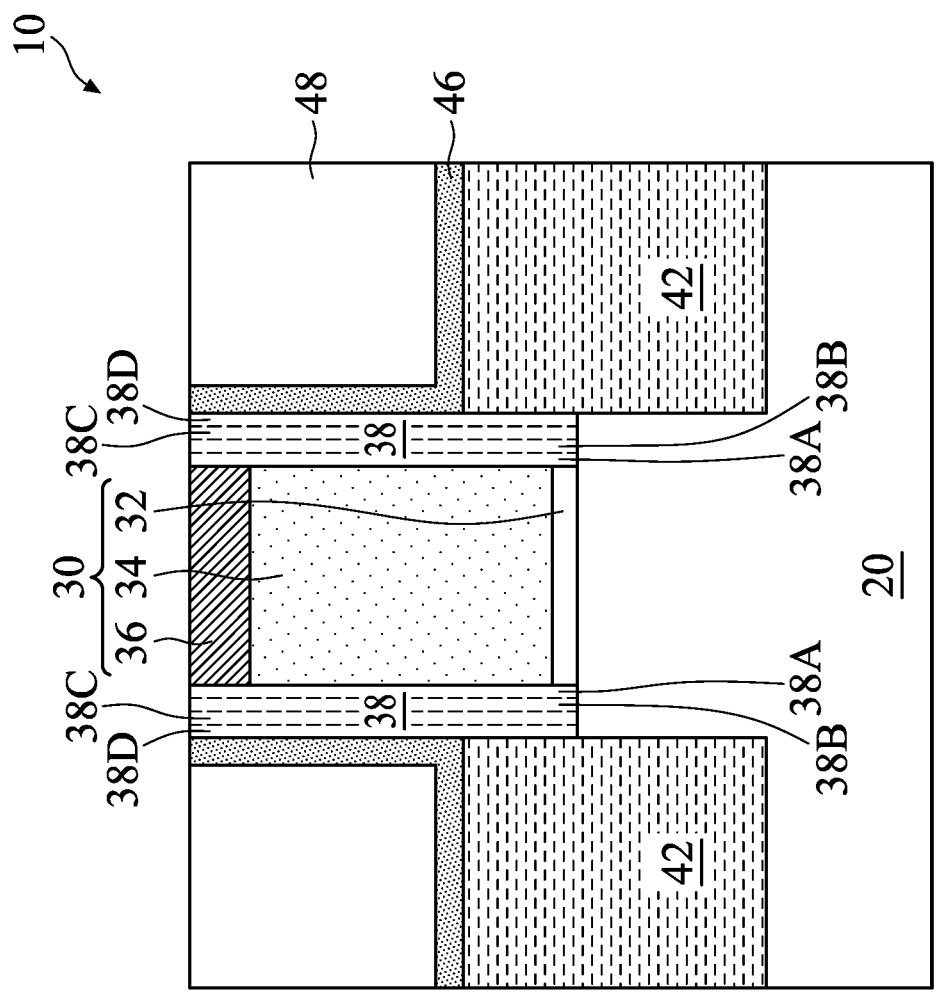
Figure 8:
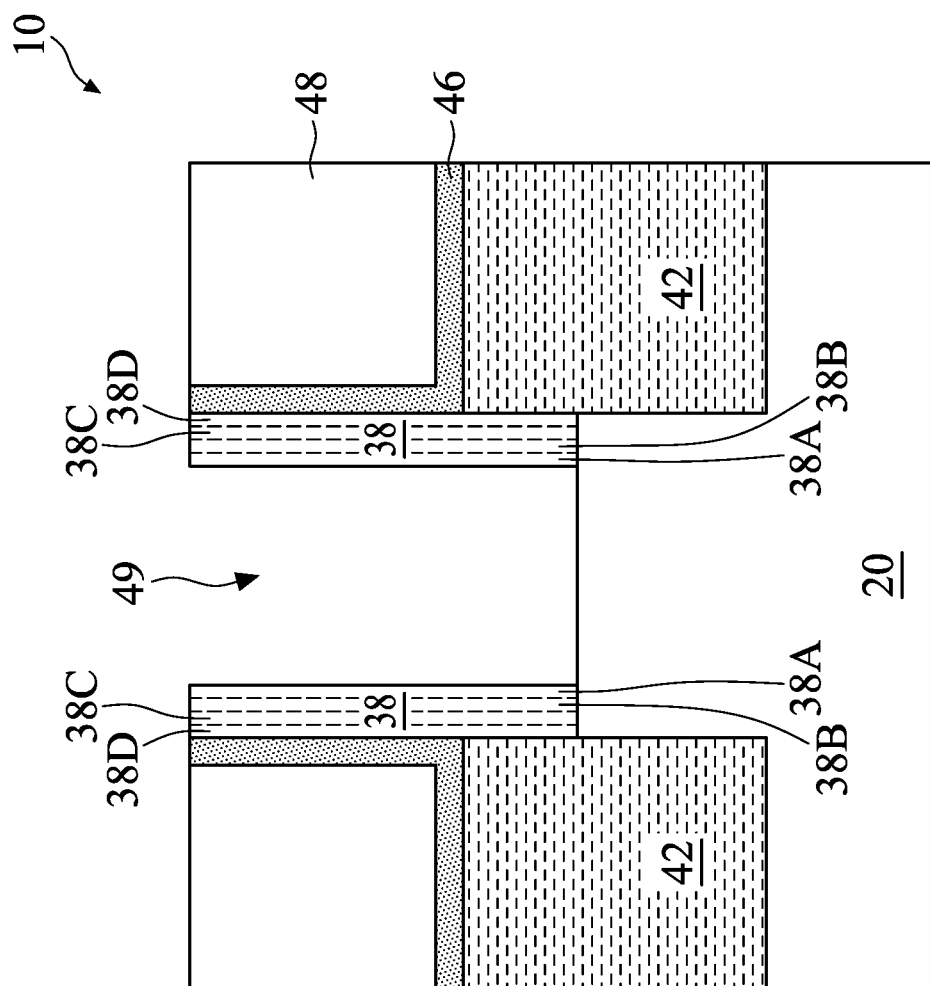

A cross-sectional view of the structure shown in FIG. 7A is illustrated in FIG. 7B. The cross-sectional view is obtained from the vertical plane containing line 7B-7B in FIG. 7A. As shown in FIG. 7B, one of dummy gate stacks 30 is illustrated.

Next, dummy gate stacks 30, which include hard mask layers 36, dummy gate electrodes 34 and dummy gate dielectrics 32, are replaced with replacement gate stacks. The replacement step includes etching hard mask layers 36, dummy gate electrodes 34, and dummy gate dielectrics 32 as shown in FIGS. 7A and 7B in one or a plurality of etching steps, resulting in trench 49 to be formed between opposite portions of gate spacers 38, as shown in FIG. 8. The respective process is illustrated as process 212 in the process flow shown in FIG. 17. The etching process may be performed using, for example, dry etching. Plasma may also be turned on in the etching process. The etching gases are selected based on the material to be etched. For example, when hard masks 36 include silicon nitride, the etching gas may include fluorine-containing process gases such as $CF_4/O_2/N_2$, $NF_3/O_2$, $SF_6$, or $SF_6/O_2$, or the like. Dummy gate electrodes 34 may be etched using $C_2F_6$, $CF_4$, $SO_2$, the mixture of HBr, $Cl_2$, and $O_2$, the mixture of HBr, $Cl_2$, and $O_2$, or the mixture of HBr, $Cl_2$, $O_2$, and $CF_2$ etc. Dummy gate dielectrics 32 may be etched using the mixture of $NF_3$ and $NH_3$ or the mixture of HF and $NH_3$.

In the etching of dummy gate stacks 30, gate spacers 38, particularly sub layers 38A, are exposed to the plasma. The sub layers 38A may include nitrogen, and hence gate spacers 38 are more resistant to the damage caused by the plasma. In accordance with some embodiments of the present disclosure, gate spacers 38 have thicknesses in the range between about 20 Å and about 50 Å, and the damaged portions may have a thickness smaller than about 10 Å. The thickness of sealing layers 38A may be reduced in the etching, for example, from a value in the range between about 15 Å and about 30 Å to a value in the range between about 5 Å and about 10 Å. Since sealing layers 38A are more resistant to the damage caused by the plasma, sealing layers 38A will have some portions remaining to protect the sub-layers 38B/38C/38D after the etching, which sub-layers have lower nitrogen atomic percentages, and hence are more prone to the damage.

Figure 9A:
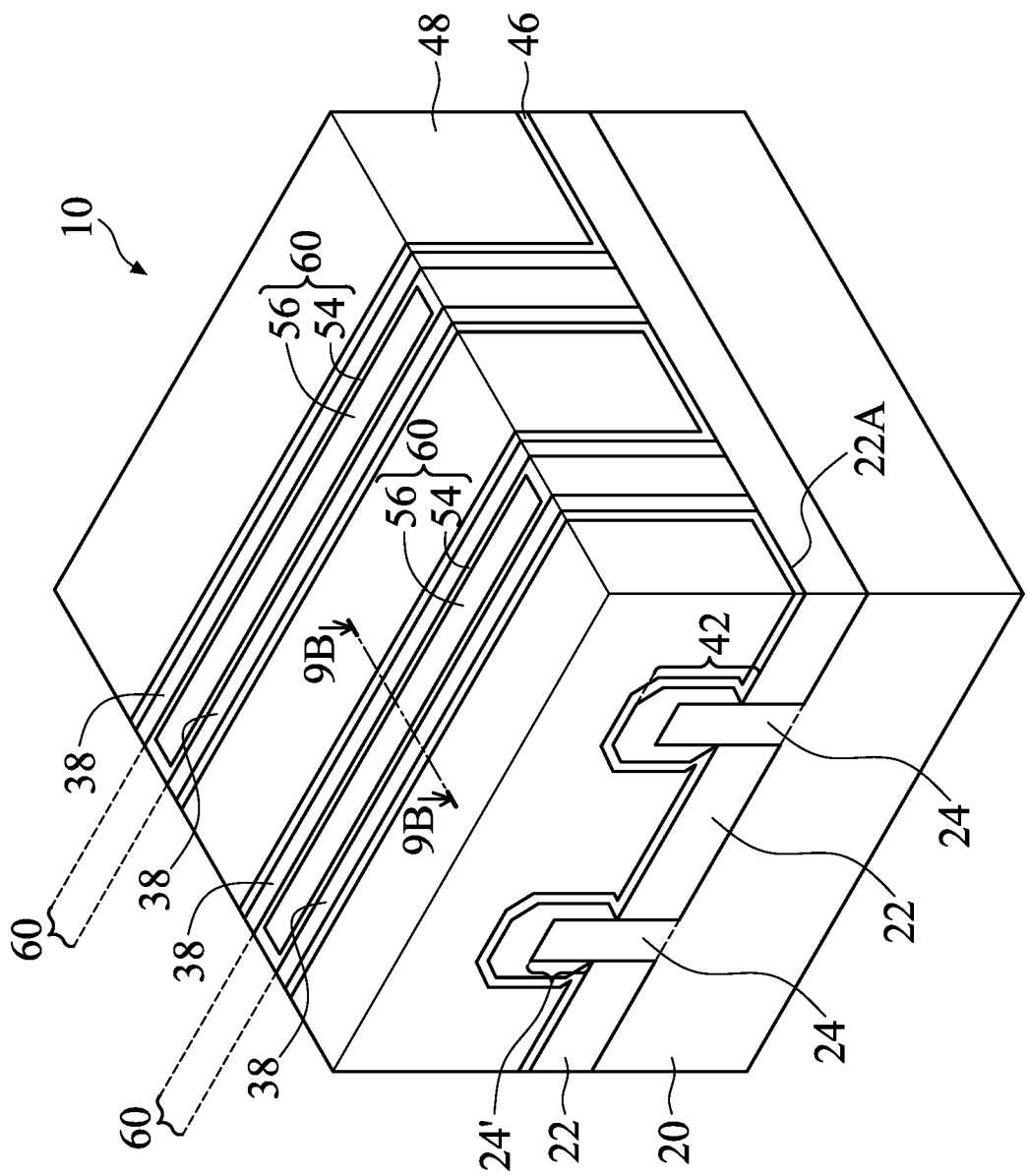
Figure 9B:
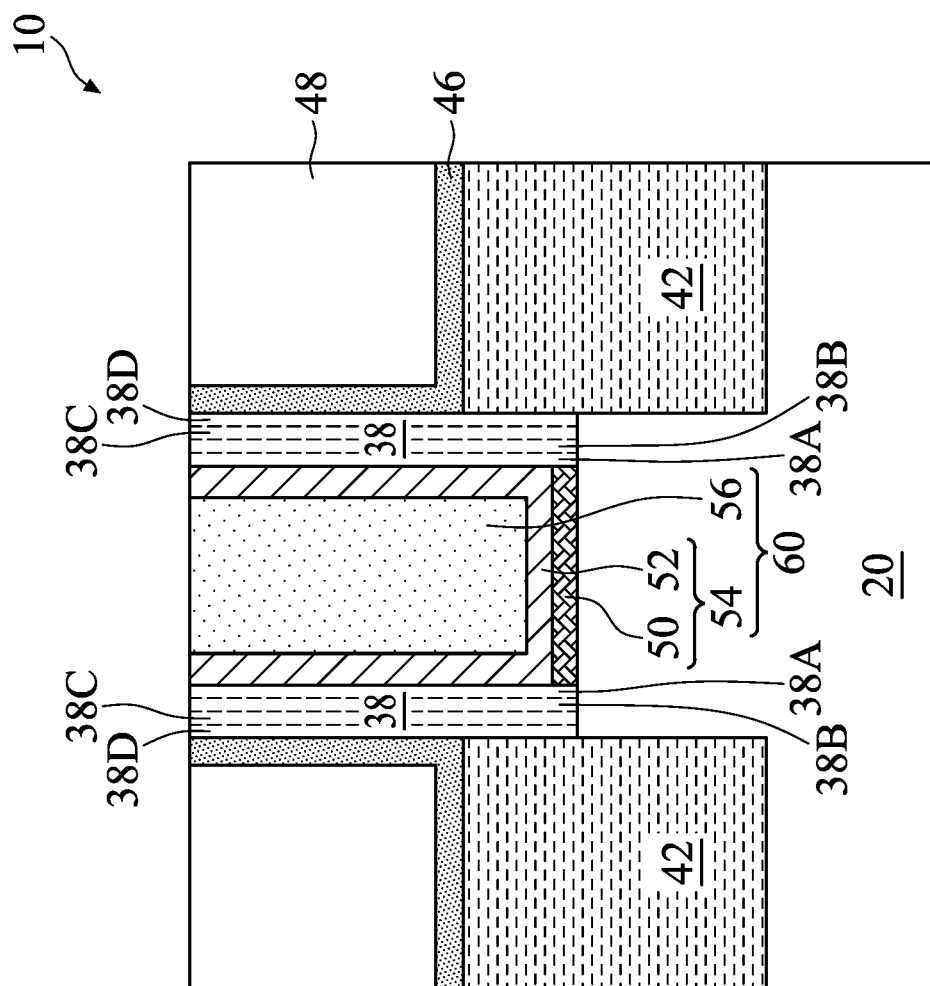

Next, referring to FIGS. 9A and 9B, (replacement) gate stacks 60 are formed, which include gate dielectric layers 54 and gate electrode 56. The respective process is illustrated as process 214 in the process flow shown in FIG. 17. FIG. 9B illustrates a cross-sectional view shown in FIG. 9A, with the cross-sectional view obtained from the plane containing line 9B-9B in FIG. 9A. The formation of gate stacks 60 includes forming/depositing a plurality of layers, and then performing a planarization process such as a CMP process or a mechanical grinding process. Gate dielectric layers 54 extend into the trenches left by the removed dummy gate stacks. In accordance with some embodiments of the present disclosure, gate dielectric layers 54 include Interfacial Layer (IL) 50 (FIG. 9B) as its lower part. IL 50 is formed on the exposed surfaces of protruding fins 24'. IL 50 may include an oxide layer such as a silicon oxide layer, which is formed through the thermal oxidation of protruding fins 24', a chemical oxidation process, or a deposition process. Gate dielectric layer 54 may also include high-k dielectric layer 52 (FIG. 9B) formed over IL 50. High-k dielectric layer 52 includes a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. High-k dielectric layer 52 is formed as a conformal layer, and extends on the sidewalls of protruding fins 24' and the sidewalls of gate spacers 38. In accordance with some embodiments of the present disclosure, high-k dielectric layer 52 is formed using ALD or CVD.

Referring again to FIGS. 9A and 9B, gate electrodes 56 are formed on top of gate dielectric layers 54, and fill the remaining portions of the trenches left by the removed dummy gate stacks. The sub-layers in gate electrodes 56 are not shown separately in FIGS. 9A and 9B, while in reality, the sub-layers are distinguishable from each other due to the difference in their compositions. The deposition of at least lower sub-layers may be performed using conformal deposition methods such as ALD or CVD, so that the thickness of the vertical portions and the thickness of the horizontal portions of gate electrodes 56 (and each of sub-layers) are substantially equal to each other Gate electrodes 56 may include a plurality of layers including, and not limited to, a Titanium Silicon Nitride (TSN) layer, a tantalum nitride (TiN) layer, a titanium nitride (TiN) layer, a titanium aluminum (TiAl) layer, an additional TiN and/or TaN layer, and a filling metal. Some of these layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include aluminum, copper, or cobalt.

Figure 10:
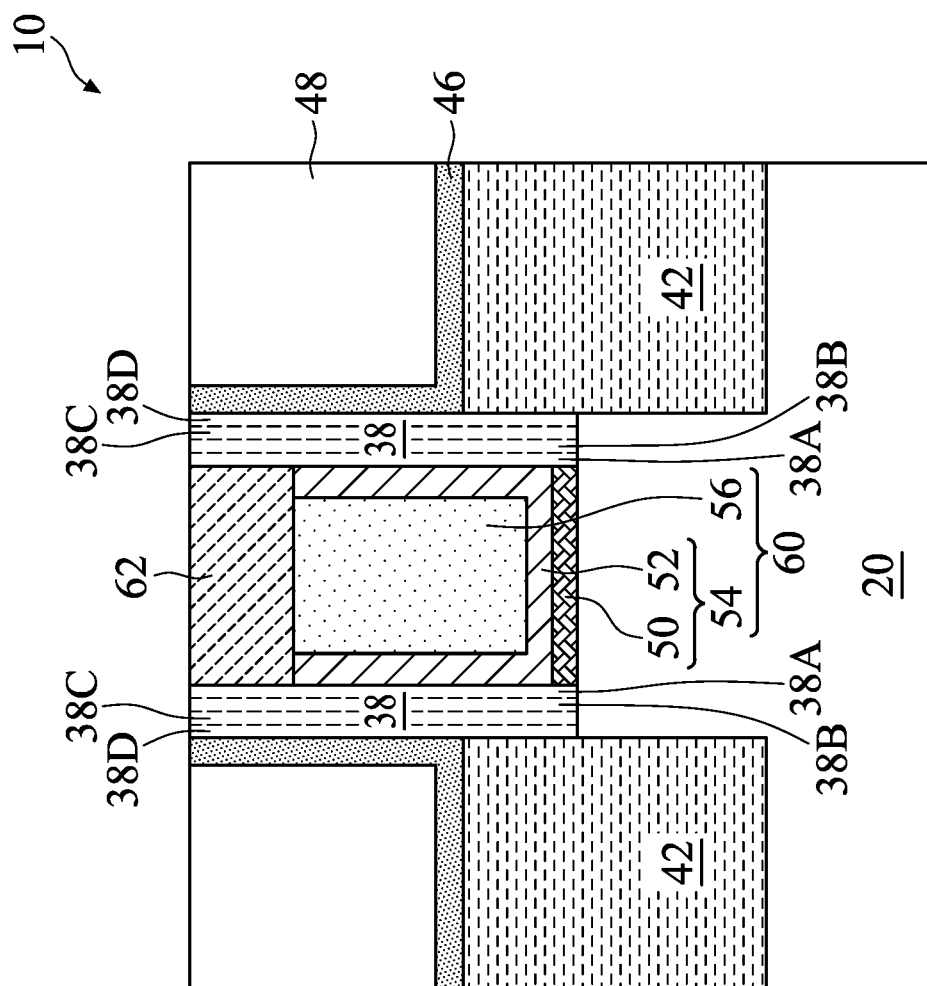

Next, as shown in FIG. 10, hard mask 62 is formed. The respective process is illustrated as process 216 in the process flow shown in FIG. 17. In accordance with some embodiments of the present disclosure, the formation of hard mask 62 includes recessing replacement gate stacks 60 through etching to form recesses, filling a dielectric material into the recesses, and performing a planarization process to remove the excess portions of the dielectric material. The remaining portions of the dielectric material are hard masks 62. In accordance with some embodiments of the present disclosure, hard masks 62 are formed of silicon nitride, silicon oxynitride, silicon oxy-carbide, silicon oxy carbo-nitride, or the like.

Figure 11:
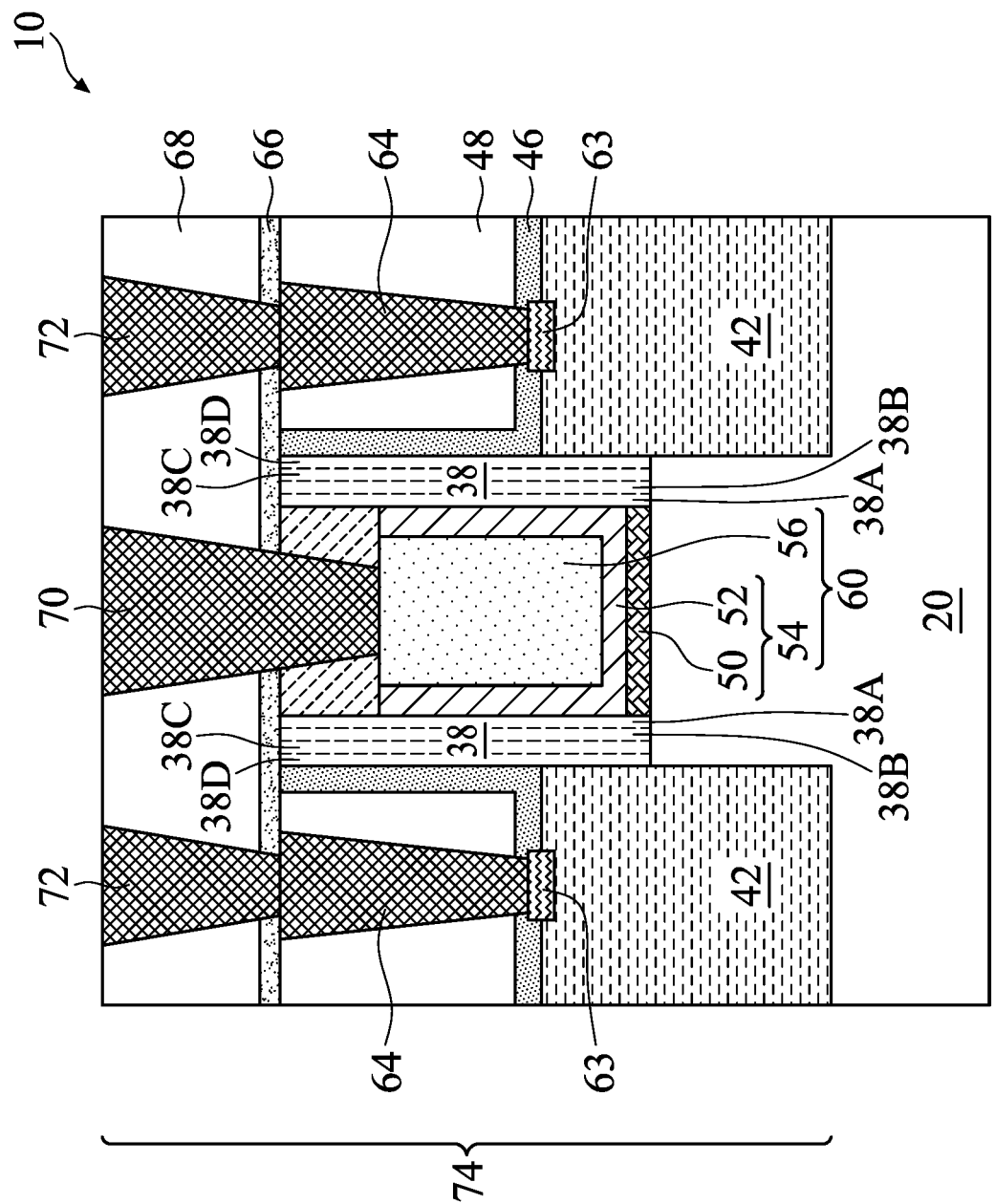

FIG. 11 illustrates the subsequent steps for forming contact plugs. Silicide regions 63 and contact plugs 64 are first formed to extend into ILD 48 and CESL 46. The respective process is illustrated as process 218 in the process flow shown in FIG. 17. Etch stop layer 66 is then formed. In accordance with some embodiments of the present disclosure, etch stop layer 66 is formed of SiN, SiCN, SiC, SiOCN, or the like. The formation method may include PECVD, ALD, CVD, or the like. Next, ILD 68 is formed over etch stop layer 66. The respective process is illustrated as process 220 in the process flow shown in FIG. 17. The material of ILD 68 may be selected from the same group of candidate materials (and methods) for forming ILD 48, and ILDs 48 and 68 may be formed of the same or different dielectric materials. In accordance with some embodiments of the present disclosure, ILD 68 is formed using PECVD, FCVD, spin-on coating, or the like, and may include silicon oxide ($SiO_2$).

ILD 68 and etch stop layer 66 are etched to form openings. The etching may be performed using, for example, Reactive Ion Etch (RIE). In a subsequent step, as shown in FIG. 11, gate contact plug 70 and source/drain contact plugs 72 are formed in the openings to electrically connect to gate electrode 56 and source/drain contact plugs 64, respectively. The respective process is illustrated as process 222 in the process flow shown in FIG. 17. FinFET 74 is thus formed.

The embodiments of the present disclosure have some advantageous features. By incorporating nitrogen into gate spacers without increasing the k value of the gate spacers, the gate spacers' resistance to plasma damage (which occurs in the etching of dummy gate stacks) is improved, while the parasitic capacitance resulted from the gate spacers is at least not increased, and possibly reduced.

In accordance with some embodiments of the present disclosure, a method includes forming a dummy gate stack over a semiconductor region of a wafer; and depositing a gate spacer layer using ALD on a sidewall of the dummy gate stack, the depositing the gate spacer layer comprises performing an ALD cycle to form a dielectric atomic layer, wherein the ALD cycle comprises introducing silylated methyl to the wafer; purging the silylated methyl; introducing ammonia to the wafer; and purging the ammonia. In an embodiment, the method further comprises performing an anneal on the wafer after the gate spacer layer is formed, wherein the anneal is performed with the wafer placed in an oxygen-containing gas. In an embodiment, the anneal is performed at a temperature in a range between about 400° C.

and about 500° C. In an embodiment, before the anneal, the gate spacer layer has a first nitrogen atomic percentage, and after the anneal, a portion of the gate spacer layer has a second nitrogen atomic percentage lower than the first nitrogen atomic percentage. In an embodiment, before the anneal, the gate spacer layer has a first k value higher than a k value of silicon oxide, and after the anneal, a portion of the gate spacer layer has a second k value lower than the k value of silicon oxide. In an embodiment, the silylated methyl has a chemical formula of $(SiCl_3)_2CH_2$. In an embodiment, the method further comprises performing an anisotropic etching on the gate spacer layer to form gate spacers on opposite sides of the dummy gate stack; and removing the dummy gate stack using dry etch, with plasma being generated in the removing the dummy gate stack. In an embodiment, the method further comprises depositing a high-k dielectric layer as a sealing layer, wherein the high-k dielectric layer comprises a portion separating the dummy gate stack from the gate spacer layer. In an embodiment, the method further comprises repeating the ALD cycle until the gate spacer layer has a thickness greater than about 20 Å.

In accordance with some embodiments of the present disclosure, a method incudes forming a dummy gate stack over a semiconductor region of a wafer; forming a dielectric layer comprising SiNOCH, wherein the dielectric layer has a first k value; and performing an anneal on the dielectric layer, wherein after the anneal, the dielectric layer has a second k value lower than the first k value. In an embodiment, the anneal is performed at a temperature in a range between about 400° C. and about 500° C. In an embodiment, the dielectric layer is formed using Atomic Layer Deposition (ALD), and the ALD comprises pulsing silylated methyl and ammonia alternatingly. In an embodiment, the anneal is performed in an oxygen-containing environment comprising $H_2O$, $O_2$, or oxygen radicals. In an embodiment, the anneal results in a k value of the dielectric layer to be reduced from a high-k value higher than 4.0 to a low-k value lower than 3.9. In an embodiment, the anneal results in a nitrogen atomic percentage in the dielectric layer to be reduced from a first value to a second value, wherein the first value is in a range between about 3 percent and about 30 percent, and the second value is in a range between about 1 percent and about 10 percent.

In accordance with some embodiments of the present disclosure, a device includes a semiconductor region; a gate stack over the semiconductor region; a gate spacer on a sidewall of the gate stack, wherein the gate spacer comprises SiNOCH, with the SiNOCH being a low-k dielectric material; and a source/drain region on a side of the gate spacer. In an embodiment, the gate spacer comprises an inner sidewall and an outer sidewall, and the outer sidewall is farther from the gate stack than the inner sidewall, and in a direction from the inner sidewall to the outer sidewall, nitrogen atomic percentages gradually reduce. In an embodiment, an entirety of the gate spacer from the inner sidewall to the outer sidewall comprises the SiNOCH having nitrogen atomic percentages in a range between about 1 percent and about 10 percent. In an embodiment, the gate spacer further comprises a high-k dielectric sealing layer in contact with the gate stack. In an embodiment, a nitrogen atomic percentage of the SiNOCH is in a range between about 1 percent and about 10 percent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate stack on a substrate;
    depositing a first spacer layer on a sidewall of the gate stack, the first spacer layer comprising silicon and carbon;
    depositing a second spacer layer on the first spacer layer, the second spacer layer comprising silicon, carbon, and nitrogen; and
    depositing a third spacer layer on the second spacer layer, the third spacer layer comprising silicon, carbon, and nitrogen, wherein a combination of the first spacer layer, the second spacer layer, and the third spacer layer has a k value of less than 4.0.

2. The method of claim 1, wherein the first spacer layer further comprises nitrogen.

3. The method of claim 1, wherein each of the first spacer layer, the second spacer layer, and the third spacer layer further comprises hydrogen.

4. The method of claim 1, wherein each of the first spacer layer, the second spacer layer, and the third spacer layer further comprises oxygen.

5. The method of claim 1 further comprising an etching process on the combination of the first spacer layer, the second spacer layer, and the third spacer layer to form a gate spacer.

6. The method of claim 1 further comprising, after the third spacer layer is deposited, performing an annealing process on the first spacer layer, the second spacer layer, and the third spacer layer in an oxygen-containing environment.

7. The method of claim 6, wherein dielectric constants of the first spacer layer, the second spacer layer, and the third spacer layer are reduced by the annealing process in in the oxygen-containing environment.

8. The method of claim 1, wherein the first spacer layer, the second spacer layer, and the third spacer layer are deposited at increasingly lower wafer temperatures.

9. The method of claim 1, wherein the first spacer layer, the second spacer layer, and the third spacer layer have increasingly reduced k values.

10. The method of claim 1, wherein the first spacer layer, the second spacer layer, and the third spacer layer have increasingly lower nitrogen atomic percentages.

11. A method comprising:
    forming a gate stack on a semiconductor substrate;
    depositing a first spacer layer on a sidewall of the gate stack;
    depositing a second spacer layer on the first spacer layer;
    depositing a third spacer layer on the second spacer layer, wherein each of the first spacer layer, the second spacer layer, and the third spacer layer comprises silicon, carbon, nitrogen, and hydrogen, and wherein the first spacer layer, the second spacer layer, and the third spacer layer have low k values of less than 3.9; and
    etching the first spacer layer, the second spacer layer, and the third spacer layer to form a gate spacer.

12. The method of claim 11, wherein each of the depositing the first spacer layer, the depositing the second spacer layer, and the depositing the third spacer layer comprises:

conducting silylated methyl to a wafer comprising the semiconductor substrate and the gate stack; and conducting ammonia to the wafer.

13. The method of claim 11, wherein the depositing the first spacer layer is performed at a first wafer temperature, the depositing the second spacer layer is performed at a second wafer temperature lower than the first wafer temperature, and the depositing the third spacer layer is performed at a third wafer temperature lower than the second wafer temperature.

14. The method of claim 11, wherein the first spacer layer has a first nitrogen percentage, the second spacer layer has a second nitrogen percentage lower than the first nitrogen percentage, and the third spacer layer has a third nitrogen percentage lower than the second nitrogen percentage.

15. The method of claim 11, wherein in a direction pointing from an inner sidewall of the gate spacer to an outer sidewall of the gate spacer, nitrogen percentages in the first spacer layer, the second spacer layer, and the third spacer layer are reduced in stages.

16. The method of claim 11 further comprising:
performing an annealing process on the first spacer layer, the second spacer layer, and the third spacer layer, wherein the annealing process results in k values of the first spacer layer, the second spacer layer, and the third spacer layer to be lowered.

17. The method of claim 16 further comprising:
removing the gate stack through a plasma etching process, wherein the first spacer layer is exposed to the plasma.

18. A method comprising:
forming a gate stack on a semiconductor substrate;
depositing a first spacer layer on a sidewall of the gate stack;
depositing a second spacer layer on the first spacer layer; and
depositing a third spacer layer on the second spacer layer, wherein each of the first spacer layer, the second spacer layer, and the third spacer layer comprises silicon, carbon, nitrogen, and hydrogen; and
after the third spacer layer is deposited, performing a plasma treatment on the third spacer layer.

19. The method of claim 18, wherein the first spacer layer, the second spacer layer, and the third spacer layer further comprise oxygen, and wherein the plasma treatment is performed in an oxygen-containing environment.

20. The method of claim 18, wherein during the plasma treatment, the semiconductor substrate is also heated.

* * * * *